(12) United States Patent
Clements et al.

(10) Patent No.: US 10,641,954 B2
(45) Date of Patent: May 5, 2020

(54) INTERFEROMETER AND METHOD OF DESIGNING AN INTERFEROMETER

(71) Applicant: OXFORD UNIVERSITY INNOVATION LIMITED, Oxford (GB)

(72) Inventors: William Clements, Oxford (GB); Peter Humphreys, Oxford (GB); Benjamin Metcalf, Oxford (GB); Steven Kolthammer, Oxford (GB); Ian Walmsley, Oxford (GB)

(73) Assignee: OXFORD UNIVERSITY INNOVATION LIMITED, Oxford (GB)

( * ) Notice: Subject to any disclaimer, the term of this patent is extended or adjusted under 35 U.S.C. 154(b) by 0 days.

(21) Appl. No.: 16/080,037

(22) PCT Filed: Feb. 24, 2017

(86) PCT No.: PCT/GB2017/050484
§ 371 (c)(1),
(2) Date: Aug. 27, 2018

(87) PCT Pub. No.: WO2017/144895
PCT Pub. Date: Aug. 31, 2017

(65) Prior Publication Data
US 2019/0086610 A1 Mar. 21, 2019

(30) Foreign Application Priority Data

Feb. 25, 2016 (GB) .................................. 1603305.2

(51) Int. Cl.
*G02B 6/42* (2006.01)
*G02B 6/02* (2006.01)
(Continued)

(52) U.S. Cl.
CPC ....... *G02B 6/12007* (2013.01); *G02F 1/3136* (2013.01); *G06F 30/00* (2020.01);
(Continued)

(58) Field of Classification Search
CPC .................................. G02B 6/42; G02B 6/02
(Continued)

(56) References Cited

U.S. PATENT DOCUMENTS 4,070,094 A * 1/1978 Martin .................... G02F 1/225
385/16
4,950,042 A * 8/1990 Gaylor .................. G02F 1/2955
385/14
(Continued)

OTHER PUBLICATIONS

Bentivegna, Marco, et al., "Experimental scattershot boson sampling," Science Advances, vol. 1, Issue 3, Apr. 17, 2015, 8 pages.
(Continued)

*Primary Examiner* — Kaveh C Kianni
(74) *Attorney, Agent, or Firm* — Withrow & Terranova, P.L.L.C.; Vincent K. Gustafson

(57) ABSTRACT

A universal interferometer (100) for coupling modes of electromagnetic radiation according to a transformation has N inputs and N outputs for inputting and outputting N modes of electromagnetic radiation into and from the interferometer. Waveguides (101, 102, 103, 104, 105) pass through the interferometer to connect the N inputs to the N outputs and to carry the N modes of electromagnetic radiation. The waveguides provide crossing points between pairs of waveguides and a reconfigurable beam splitter (107) implements a reconfigurable reflectivity and a reconfigurable phase shift at each crossing point. The waveguides and crossing points are arranged such that each of the N modes of electromagnetic radiation is capable of coupling with each of the other modes of electromagnetic radiation at respective reconfigurable beam splitters. The couplings between modes at the
(Continued)

reconfigurable beam splitters are configured such that the interferometer implements a transformation of the N modes between the N inputs and the N outputs.

18 Claims, 6 Drawing Sheets

(51) Int. Cl.
*G02B 6/12* (2006.01)
*H04B 10/2581* (2013.01)
*G02F 1/313* (2006.01)
*G06F 30/00* (2020.01)
*G02B 6/293* (2006.01)
*H04B 10/70* (2013.01)

(52) U.S. Cl.
CPC ..... *H04B 10/2581* (2013.01); *G02B 6/29344* (2013.01); *G02B 6/29355* (2013.01); *G02B 6/29395* (2013.01); *H04B 10/70* (2013.01)

(58) Field of Classification Search
USPC .......................................................... 385/14
See application file for complete search history.

(56) References Cited

U.S. PATENT DOCUMENTS

| | | | | |
|---|---|---|---|---|
| 5,044,712 | A * | 9/1991 | Soref | G02F 1/1326 349/172 |
| 5,933,554 | A * | 8/1999 | Leuthold | G02F 1/3517 385/14 |
| 6,084,992 | A * | 7/2000 | Weber | G02B 6/12007 385/16 |
| 7,376,309 | B2 * | 5/2008 | Gulde | G02B 6/12007 372/102 |
| 7,406,226 | B1 * | 7/2008 | Horst | G02B 6/12007 372/94 |
| RE41,570 | E * | 8/2010 | Greiner | G02B 5/203 359/10 |
| 8,473,539 | B1 * | 6/2013 | Rao | G06F 17/16 708/201 |
| 2004/0239943 | A1 * | 12/2004 | Izatt | G01N 21/4795 356/479 |
| 2006/0127024 | A1 * | 6/2006 | Smith | G02B 6/12007 385/132 |
| 2012/0224807 | A1 * | 9/2012 | Winzer | G02B 6/14 385/28 |
| 2014/0299743 | A1 * | 10/2014 | Miller | G02B 27/145 250/204 |
| 2016/0112192 | A1 * | 4/2016 | Earl | H04L 9/0825 380/44 |
| 2018/0031689 | A1 * | 2/2018 | Ben-Ari | G01S 13/4454 |
| 2018/0120085 | A1 * | 5/2018 | Lane | G01B 9/02027 |

OTHER PUBLICATIONS

Carolan, Jacques, et al., "Quantum Optics: Universal linear optics," Science, vol. 349, Issue 6249, Aug. 14, 2015, 6 pages.
Carolan, Jacques, et al., "Universal linear optics," Science, vol. 349, Issue 6249, Aug. 14, 2015, 7 pages.
Clements, William, et al., "An Optimal Design for Universal Multiport Interferometers," Optica, vol. 3, Issue 12, Mar. 2016, 8 pages.
Crespi, Andrea, et al., "Experimental boson sampling in arbitrary integrated photonic circuits," Nature Photonics, Dec. 2012, 10 pages.
Goh, Takashi, et al., "Low-Loss and High-Extinction-Ratio Silica-Based Strictly Nonblocking 16 x 16 Thermooptic Matrix Switch," IEEE Photonics Technology Letters, vol. 10, Issue 6, Jun. 1998, pp. 810-812.
Harris, Nicholas, et al., "Bosonic transport simulations in a large-scale programmable nanophotonic processor," Jul. 20, 2015, 8 pages.
Miller, David, "All linear optical devices are mode converters," Optics Express, vol. 20, Issue 21, 2012, Optical Society of America, 6 pages.
Miller, David, "Perfect optics with imperfect components," Optica, vol. 2, Issue 8, Aug. 2015, Optical Society of America, pp. 747-750.
Miller, David, "Self-configuring universal linear optical component," Photonics Research, vol. 1, Issue 1, Jun. 2013, Chinese Laser Press, 15 pages.
Reck, Michael, et al., "Experimental Realization of Any Discrete Unitary Operator," Physical Review Letters, vol. 73, Issue 1, Jul. 4, 1994, The American Physical Society, pp. 58-61.
Office Action for United Kingdom Patent Application No. 1603305. 2, dated Aug. 16, 2016, 5 pages.
International Search Report and Written Opinion for International Application No. PCT/GB2017/050484, dated May 4, 2017, 13 pages.
International Preliminary Report on Patentability for International Application No. PCT/GB2017/050484, dated Sep. 7, 2018, 7 pages.

* cited by examiner

Fig. 3a $O =$ [5×5 matrix of *]

101
102
103
104
105

203

Fig. 3b $OT_{1,2}^{-1} =$ [5×5 matrix of * with O at bottom right position]

101
102
103
104
105

203

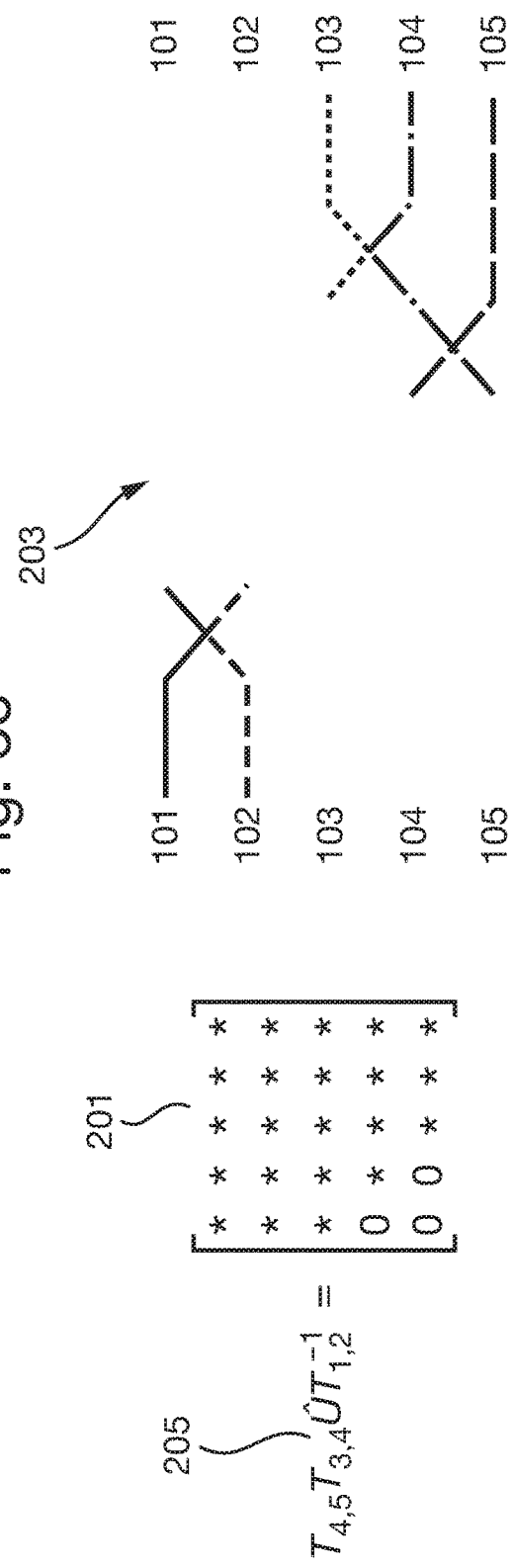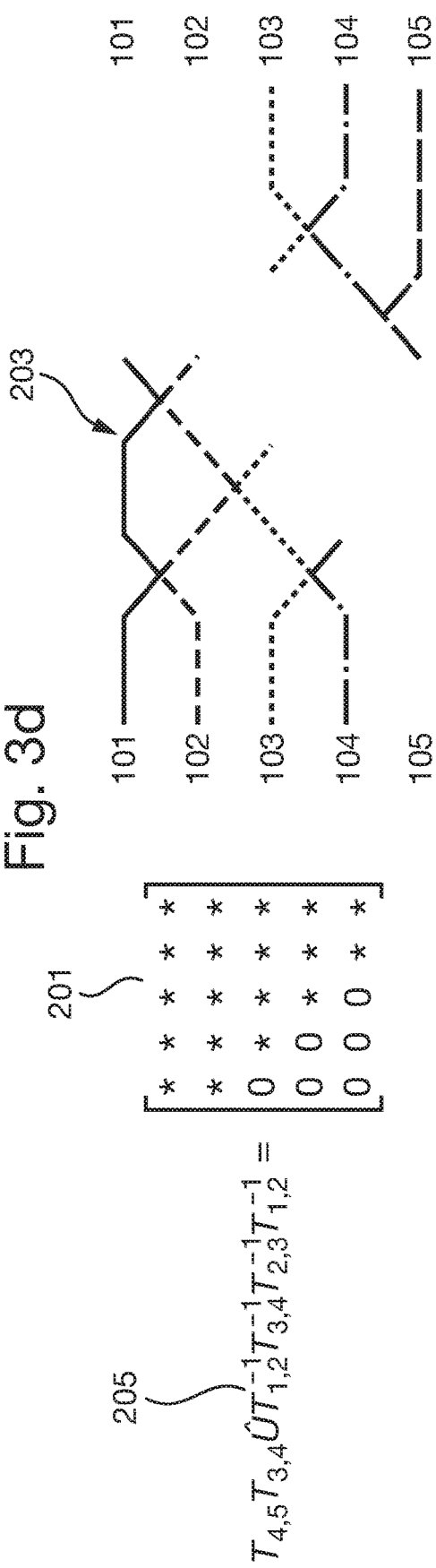

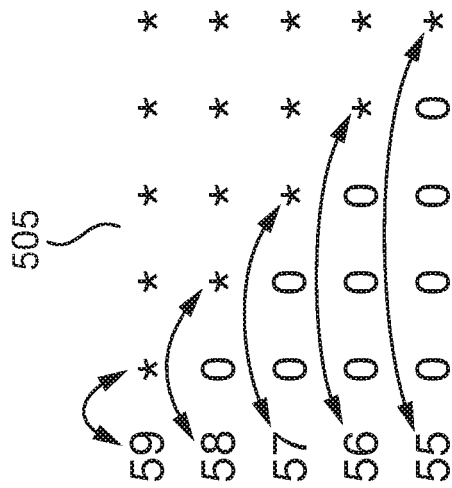
Fig. 6c
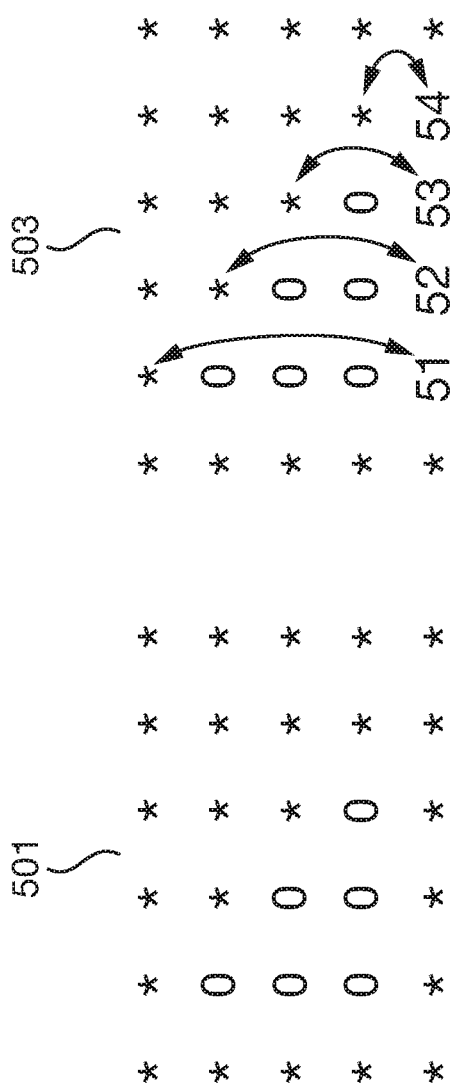
Fig. 6b
Fig. 6a

INTERFEROMETER AND METHOD OF DESIGNING AN INTERFEROMETER

This application is a 35 U.S.C. § 371 national phase filing of International Application No. PCT/GB2017/050484 filed on Feb. 24, 2017, and claims the benefit of United Kingdom Patent Application No. 1603305.2, filed on Feb. 25, 2016, wherein the disclosures of the foregoing applications are hereby incorporated by reference herein in their respective entireties.

This invention relates to a method of designing an interferometer for coupling a plurality of modes of electromagnetic radiation, in particular to a method of designing an integrated photonics interferometer.

Optical systems, e.g. integrated photonics interferometers, may be used to manipulate a number of different modes of light to provide desired linear transformations between input and output channels. Such systems are particularly useful in the telecommunications field as well as in quantum optics, where it is desired to be able to manipulate multiple modes of light simultaneously.

Controllable interference between multiple modes of light is at the heart of linear optical technologies. Typical photonics interferometers may be implemented on an integrated circuit as a mesh of beam splitters and phase shifters, and designed with an architecture that physically implements the desired multimode interference or transformation. Conveniently the desired multimode transformation (for an N mode interferometer) may be defined first as a unitary (N×N) matrix (for N modes that are to be manipulated by the circuit). This unitary matrix may then be decomposed to a diagonal matrix to obtain parameters that describe the physical interactions between the modes for a given circuit architecture. These physical interactions (i.e. the individual interferences between the modes of light) may be implemented by, for example, beam splitters and phase shifters within the given architecture according to the parameters (the matrix factors) obtained from the decomposition of the unitary matrix.

One such architecture, for which the unitary matrix describing the desired multimode interference may be decomposed using the Reck decomposition method to fit this architecture, is shown in FIG. 1. FIG. 1 shows a schematic of a layout of an interferometer 10 having five modes. The five modes are input into the interferometer 10 and travel along five separate paths 11, 12, 13, 14, 15. The triangular arrangement of the interferometer 10 means that each of the paths 11, 12, 13, 14, 15 crosses each of the other paths 11, 12, 13, 14, 15, such that each of the modes may interact (e.g. be coupled or interfered) with each of the other modes.

While the layout of the interferometer for the Reck decomposition uses the minimum number of crossing points in order to provide interactions for each mode with each of the other modes, it can be seen from the interferometer 10 in FIG. 1, that its layout is not optimal in terms of the physical use of space, i.e. the upper path 15 travels half the length of the interferometer before crossing another path. This results from the method used in the Reck decomposition. It also means that the, e.g. optical, losses and path lengths for different modes are not balanced, which can become a significant problem when the number of modes is large (as is often the case for photonics interferometers), e.g. owing to fabrication imperfections. The result of this is that it may become difficult to implement the desired multimode interference.

The aim of the present invention is to provide an improved interferometer for coupling multiple modes of electromagnetic radiation through an improved method of designing an interferometer.

When viewed from a first aspect the invention provides a method of designing an interferometer for coupling a plurality of modes of electromagnetic radiation, the method comprising:

for an interferometer comprising:
  N inputs for inputting N modes of electromagnetic radiation into the interferometer,
  N outputs for outputting N modes of electromagnetic radiation from the interferometer, and
  a plurality of waveguides arranged to pass through the interferometer to connect the N inputs to the N outputs and for carrying the N modes of electromagnetic radiation through the interferometer,
wherein:
  N is a natural number,
  the plurality of waveguides are arranged to provide a plurality of crossing points between pairs of the plurality of waveguides such that at each crossing point the two modes of electromagnetic radiation carried by the two respective waveguides are capable of coupling with each other, wherein the plurality of waveguides and the plurality of crossing points are arranged such that each of the N modes of electromagnetic radiation is capable of coupling with each of the other modes of electromagnetic radiation at respective crossing points, and
  the plurality of waveguides are arranged such that the plurality of crossing points are arranged into N groups along the plurality of waveguides from the inputs to the outputs through the interferometer, wherein each group contains the maximum number of possible crossing points between pairs of waveguides, and wherein the crossing points in each group involve pairs of adjacent waveguides whose paths were not crossed in the previous group of crossing points:
receiving a unitary matrix describing a desired transformation to be performed by the interferometer;
operating on the unitary matrix with a plurality of transformation matrices to decompose the unitary matrix into a diagonal matrix, wherein the transformation matrices used to decompose the unitary matrix each represent the coupling between a pair of modes at a crossing point of a pair of waveguides, and wherein the transformation matrices are arranged to operate on the unitary matrix in an order that matches a sequence in which the crossing points in the interferometer may be arranged;
determining, using the transformation matrices, the coupling for the pair of modes at each of the plurality of crossing points for use in designing the interferometer.

The present invention therefore provides a method of designing an interferometer, for an interferometer that is arranged to couple a plurality of modes of electromagnetic radiation. The interferometer has N inputs and N outputs for inputting and outputting N modes of electromagnetic radiation into and from the interferometer respectively (N is a natural number, greater than or equal to 2). The N modes of electromagnetic radiation are carried via a plurality of waveguides between the N inputs and N outputs.

The layout of the interferometer is such that the plurality of waveguides are arranged to provide crossing points for each of the N modes to couple to each of the other modes, with a pair of modes being coupled at each crossing point. Thus at each crossing point a pair of waveguides carries the pair of modes to couple to each other, such that at each crossing point the pair of modes of electromagnetic radiation being carried by the respective pair of waveguides are able to couple (e.g. interact through interference) with each other.

The layout of the waveguides in the interferometer and the crossing points is such that travelling along the waveguides through the interferometer from the inputs to the outputs, pairs of adjacent waveguides are arranged to cross at N groups of crossing points. At a group of crossing points, the maximum number of pairs of waveguides is crossed, provided that none of the pairs of waveguides has been crossed in the previous group (i.e. the adjacent group closer to the input of the interferometer). For example, when N is an odd number, this results in there being (N−1)/2 crossing points in each group. When N is even, this results in there being N/2 crossing points being followed by N/2−1 crossing points, with this pair of groups being repeated for the N groups.

For this layout of the waveguides through the interferometer, the details of the couplings between the pairs of modes of electromagnetic radiation at the respective coupling points need to be determined from the overall desired transformation of the, e.g. N, modes to be performed by the interferometer, to then allow the interferometer to be designed and, e.g., manufactured. To do this, a unitary matrix describing the desired transformation, e.g. of the N modes from the N inputs to the N outputs, to be implemented by the interferometer is used, e.g. first the unitary matrix is defined according to the desired transformation.

The method of the present invention includes the steps of receiving this unitary matrix and then decomposing the unitary matrix into a diagonal matrix. The unitary matrix is decomposed into a diagonal matrix by operating on it with a plurality of transformation matrices. Each of these transformation matrices represents the respective coupling (interaction) between a pair of modes of electromagnetic radiation at a crossing point of a pair of waveguides carrying the modes of electromagnetic radiation (e.g. there is a one-to-one correspondence between the transformation matrices and the couplings at the respective crossing points). The transformation matrices are applied to the unitary matrix in an order that matches a sequence in which it is physically possible to arrange the crossing points (corresponding to the respective transformation matrices that represent the couplings between the respective pairs of modes at the crossing points) in the interferometer, i.e. a sequence that matches the order in which pairs of modes may be crossed with each other at the crossing points according to the defined layout of the interferometer.

Once the transformation matrices have been determined, because they describe the coupling between a pair of modes of electromagnetic radiation at a crossing point of a pair of waveguides carrying the modes of electromagnetic radiation, these transformation matrices are then used to determine the necessary coupling between the pair of modes at each crossing point to implement the overall desired transformation of the, e.g. N, modes input into the interferometer, such that these couplings may be used in the design and manufacture of an interferometer that implements this overall desired transformation, i.e. to provide the desired couplings between the, e.g. each of the N modes with each of the other, modes.

The Applicant has appreciated that an alternative method of decomposing a unitary matrix describing the desired transformation to be implemented by the interferometer may be provided, because it is not necessary for the paths through the interferometer to have a triangular layout such that the modes are interacted in turn (and thus the unitary matrix to be decomposed for one mode after another) as is done when using the Reck decomposition. Instead, according to the method of the present invention for decomposing the unitary matrix, the layout of the interferometer (which may be approximately rectangular) allows multiple pairs modes of electromagnetic radiation (i.e. the maximum number in each group) to be coupled to each other at each step (group) from the input to the output of the interferometer.

Thus it will be appreciated that the method of designing the interferometer provides a decomposition of a unitary matrix (describing the desired transformation of the modes of electromagnetic radiation input into the interferometer) that helps to provide an interferometer having an, e.g. optimum, layout, in terms of use of space. This layout also provides the opportunity to interact each of the modes with each of the other modes and thus provides flexibility to the designer in terms of the choices of the overall desired transformation to be performed. The decomposition also provides information as to how pairs of modes of electromagnetic radiation passing through the interferometer should be interacted, in order to implement the desired overall transformation.

Owing to crossing the maximum number of modes at each stage (i.e. in each group the waveguides cross their nearest neighbour as soon as possible) as the waveguides pass through the interferometer, it can be seen that the "depth" of the paths through the waveguides (i.e. the number of groups of crossing points) is N, for N>2. This compares to a depth of 2N−3 for the corresponding layout when using the Reck decomposition, which is greater than N for N>3.

This, e.g. optimum, layout for an interferometer having these properties means that, particularly when an interferometer for a large number of modes is to be provided (i.e. when N is large), the interferometer may be provided in up to half the amount of space compared to previous interferometers implementing similar transformations (i.e. a depth of N/(2N−3) tends to ½ when N is large). Minimising the space occupied by the interferometer (its "footprint") may help to minimise the losses from the modes of electromagnetic radiation (owing to the shorter distance that the modes may travel through the interferometer) and the resources, e.g. for integrated circuits, that are needed to design and manufacture the interferometer. Furthermore, the design maximises the size of the interferometer and therefore the number of modes that are able to be interacted with each other for a given platform.

It will also be appreciated that the layout of the interferometer according to the present invention is more balanced than the layout for when the Reck decomposition is used (in terms of the number of crossing points at each step through the interferometer) which thus helps to balance the losses between the modes. This results in the actual transformation of the modes being performed in practice by the interferometer being closer to the desired theoretical transformation, i.e. as defined by the unitary matrix.

The Applicant also considers a universal photonics device (e.g. a photonics device with reconfigurable beam splitters and phase shifters, that is able to couple each of its modes with each of the other modes, such that any desired overall transformation may be implemented by the device) according to this design for implementing a transformation to be novel and inventive in its own right and thus when viewed from a further aspect the invention provides a universal interferometer for coupling a plurality of modes of electromagnetic radiation according to a transformation comprising:

N inputs for inputting N modes of electromagnetic radiation into the interferometer;

N outputs for outputting N modes of electromagnetic radiation from the interferometer; and a plurality of waveguides arranged to pass through the interferometer to connect the N inputs to the N outputs and for carrying the N modes of electromagnetic radiation through the interferometer;

wherein:

N is a natural number;

the plurality of waveguides are arranged to provide a plurality of crossing points between pairs of the plurality of waveguides, wherein a reconfigurable beam splitter arranged to implement a reconfigurable reflectivity and a reconfigurable phase shift is arranged at each of the plurality of crossing points, such that at each reconfigurable beam splitter the two modes of electromagnetic radiation carried by the two respective waveguides to the crossing point are capable of coupling with each other with a reconfigurable reflection coefficient and a reconfigurable phase shift coefficient, wherein the plurality of waveguides and the plurality of crossing points are arranged such that each of the N modes of electromagnetic radiation is capable of coupling with each of the other modes of electromagnetic radiation at respective reconfigurable beam splitters; and the plurality of waveguides are arranged such that the plurality of crossing points are arranged into N groups along the plurality of waveguides from the inputs to the outputs through the interferometer, wherein each group contains the maximum number of possible crossing points between pairs of waveguides, and wherein the crossing points in each group involve pairs of adjacent waveguides whose paths were not crossed in the previous group of crossing points; and the couplings between the pairs of modes at each of the reconfigurable beam splitters are configured such that the interferometer implements a transformation of the N modes between the N inputs and the N outputs.

As will be appreciated by those skilled in the art, this aspect of the present invention can, and preferably does, include any one or more or all of the preferred and optional features of the present invention discussed herein, as appropriate.

The interferometer may be configured to couple the modes of any suitable and desired type of electromagnetic radiation. Thus one or more (and preferably all) of the inputs, outputs, waveguides and crossing points may be configured to couple the modes of any suitable and desired type of electromagnetic radiation. In one embodiment the electromagnetic radiation has a wavelength between 400 nm and 700 nm (i.e. visible light) and thus the (e.g. optical) interferometer is configured to couple modes of electromagnetic radiation having these wavelengths. However in a preferred embodiment the electromagnetic radiation (and thus the modes thereof) used to couple using the interferometer has a wavelength of between 700 nm and 1600 nm (and thus the interferometer and its components are preferably configured to couple modes of electromagnetic radiation having these wavelengths). Near infrared radiation (i.e. between 700 nm and 1600 nm) has a low loss in silicon (which may be used in an integrated photonics circuit) and is thus particularly suited for use with the interferometer.

It will be appreciated that the design of the interferometer according to preferred embodiments of the invention enable it to be used as a universal photonics chip (e.g. a reconfigurable photonics chip that is able to couple each of its modes with each of the other modes, such that any desired overall transformation may be implemented by the chip). Alternatively, as discussed below, the design of the interferometer according to preferred embodiments of the invention may enable the interferometer to implement a linear transformation for a plurality of input modes.

Any suitable and desired number of modes of electromagnetic radiation may be used with the interferometer, and thus the interferometer may comprise any suitable and desired number of inputs, outputs, waveguides and crossing points, i.e. N may be any suitable and desired number. In a preferred embodiment N is greater than 3, e.g. greater than 10, e.g. greater than 50, e.g. greater than 100. N (and thus the number of modes) may even be several hundred if not several thousand, as may be desired in a complicated integrated photonics system.

The interferometer being designed, to couple the, e.g. N, input modes of electromagnetic radiation according to the desired transformation, may be arranged in any suitable and desired way, e.g. the layout of the inputs, waveguides and outputs. Preferably the interferometer has only $N(N-1)/2$ crossing points (and thus preferably the unitary matrix is decomposed using $N(N-1)/2$ transformation matrices). It will be appreciated that this is the minimum number of crossing points necessary for each of the N modes input into the interferometer to be capable of coupling with each of the other modes (i.e. only once), using crossing points where two waveguides cross to couple the two respective modes of electromagnetic radiation being carried by the waveguides. This thus helps to minimise the number of, e.g., optical elements that the interferometer is required to have in order to couple the two modes of electromagnetic radiation at each of the crossing points.

Each group of crossing points of the waveguides in the interferometer contains the maximum number of possible crossing points between pairs of modes. When N is odd, preferably the number of crossing points in each group is $(N-1)/2$, with this number being repeated in each group until there are a total of $N(N-1)/2$ crossing points, e.g. until all the modes have been crossed with all the other modes. When N is even, preferably the number of crossing points in each pair of groups is $N/2$ followed by $N/2-1$ (or vice versa), with this number being repeated in each group until there are a total of $N(N-1)/2$ crossing points, e.g. until all the modes have been crossed with all the other modes. Thus, for example, when $N=6$, the number of crossing points is 3 followed by 2, which is repeated until all the modes have been crossed with all the other modes.

The plurality of waveguides and plurality of crossing points may be configured in any suitable and desired way in order to couple the respective pair of modes of electromagnetic radiation passing therethrough according to the desired overall transformation. In a preferred embodiment the path lengths of each of the waveguides between adjacent crossing points (along the path through the interferometer from the input to the output) are approximately equal. This helps to match the (e.g. optical) losses along each path through the interferometer as mismatched path lengths (and thus losses) may modify the transformation of the modes from the desired transformation. Preferably also the number of crossing points that each mode passes through (e.g. along each possible path through the interferometer) is approximately equal. This also helps to match the (e.g. optical) losses along each path through the interferometer as the modes of electromagnetic radiation will experience bending and/or scattering at the crossing points.

The crossing points between pairs of modes may each be configured in any suitable and desired way in order to couple the respective pair of modes of electromagnetic radiation passing therethrough, according to the interaction for the pair of modes as determined from the transformation matrices output from the decomposition of the unitary matrix. In a preferred embodiment a beam splitter is arranged at each of one or more (and preferably all) of the crossing points, wherein (each of) the beam splitter(s) is arranged to couple the pair of modes at the respective crossing point according to the determined interaction for the crossing point from the respective transformation matrix.

The transformation matrices that are used to decompose the unitary matrix may take and suitable and desired form. Thus the coupling for each of the pairs of modes at each of the plurality of crossing points may be determined from the respective transformation matrices in any suitable and desired way. It follows that the respective crossing points, e.g. the beam splitters and/or phase shifters, may be configured in any suitable and desired way to couple the pairs of modes at the respective crossing points according to the determined coupling for the crossing point from the respective transformation matrices.

In a preferred embodiment each of the transformation matrices comprises one or more elements that are representative of one (or preferably both) of a reflectivity (or transmission) and a phase shift of the coupling between the pair of modes at the respective crossing point, and thus the coupling for each of the pair of modes may be described by a (relative) reflectivity (i.e. the ratio of the amplitudes of the pair of modes input to a crossing point that are transmitted into the respective pair of modes output from the crossing point) and/or a (relative) phase shift between the pair of modes at the respective crossing point. Thus preferably the method comprises determining a reflectivity coefficient and/or a phase shift coefficient from each of the transformation matrices; determining, using the reflectivity coefficient and the phase shift coefficient, the relative reflectivity and relative phase shift for the coupling of each of the pairs of modes at the respective crossing points for use in designing and manufacturing the interferometer. Thus the crossing points (e.g. the beam splitters) are preferably each arranged to couple the respective pair of modes according to the determined reflectivity coefficient and/or the determined phase shift coefficient.

When beam splitters are used to couple each of the pair of modes of electromagnetic radiation passing through the respective crossing points, each beam splitter may be configured in any suitable and desired way to couple the respective pair of modes of electromagnetic radiation according to the coupling determined from the respective transformation matrix, e.g. with a particular reflection coefficient and/or a particular phase shift coefficient as determined from the respective transformation matrix. The beam splitters could each be designed and manufactured with a fixed reflectivity and/or fixed phase shift, based on the couplings determined from the respective transformation matrices (thus giving a fixed interferometer only able to implement a single transformation). However, preferably each of the beam splitters is adjustable, e.g. reconfigurable. This allows a general purpose interferometer to be provided with the layout as described above, and then the beam splitters can be configured, e.g. programmed (e.g. controlled by processing circuitry), to implement the reflectivity and/or phase shift as determined from the respective transformation matrices.

In one embodiment each beam splitter comprises a Mach-Zehnder interferometer, e.g. a reconfigurable Mach-Zehnder interferometer (e.g. comprising a thermo-optic phase shifter). Preferably each Mach-Zehnder interferometer comprises two 50:50 directional couplers, preceded by a phase shifter at one of the input ports of the Mach-Zehnder interferometer.

In one embodiment each crossing point, e.g. each beam splitter, is configured to couple the respective pair of modes with a reflection coefficient and a phase shift coefficient. However, the determined reflection coefficient may able to be implemented independently from the determined phase shift coefficient. Thus, in another embodiment one or more (or all) of the crossing points, are arranged to implement the respective determined reflection coefficient separately from the respective determined phase shift coefficient (e.g. in separate components). Thus one or more of the crossing points may comprise a beam splitter configured to couple the respective pair of modes with a particular reflection coefficient determined from the respective transformation matrix and a (separate) phase shifter configured to couple the respective pair of modes with a particular phase shift coefficient determined from the respective transformation matrix. Indeed, because the phase shift may be implemented as a relative phase shift between the pair of modes, the interferometer may comprise phase shifters arranged separately from the beam splitters, e.g. between crossing points (before or after the crossing point), wherein each phase shifter is arranged to introduce a phase shift in one mode relative to another mode (preferably the adjacent mode in the interferometer).

Owing to the phase shift being relative between one mode and an adjacent mode (e.g. that are to be coupled at a crossing point), each crossing point may comprise two phase shifters arranged to couple the respective pair of modes with a particular (relative) phase shift coefficient determined from the respective transformation matrix. Alternatively each of the waveguides for the pair of modes (e.g. between crossing points) may comprise a phase shifter.

(It may be the case that the decomposition of the unitary matrix determines, for one or more crossing points, that there is no interaction between the pair of modes passing through these crossing points, and thus the respective pair of waveguides for each of these crossing points may be arranged such that the modes pass through the crossing point without interacting, e.g. a beam splitter and/or a phase shifter may not be provided at these crossing points.)

The phase shifters may comprise any suitable and desired type of phase shifter. In one embodiment the phase shifters comprise thermo-optic phase shifters, e.g. comprising resistors adjacent the respective waveguides. Preferably each of the phase shifters is adjustable, e.g. reconfigurable.

In one embodiment the (e.g. adjustable) phase shifters and/or the (e.g. adjustable) beam splitters are computer-controlled.

For the interferometer described above, the method of designing the interferometer so that it is able to couple a plurality of modes of electromagnetic radiation according to the desired overall transformation will now be described. First, a unitary matrix describing the desired transformation, e.g. of the N modes from the N inputs to the N outputs, to be performed by the interferometer is received. In a preferred embodiment the method first comprises the step of defining a unitary matrix describing the desired transformation, e.g. of the N modes from the N inputs to the N outputs, to be performed by the interferometer.

The unitary matrix may be defined in any suitable and desired way. In a preferred embodiment the unitary matrix is defined by an N×N unitary matrix that describes the transformation of the annihilation operators of the N modes of the interferometer that the unitary matrix represents, wherein the annihilation operators and the unitary matrix satisfy the equation: $\hat{a}_{out}=\hat{U}\hat{a}_{in}$, where $\hat{a}_{out}=(\hat{a}_{out,1}, \hat{a}_{out,2}, \ldots, \hat{a}_{out,N})$ and $\hat{a}_{in}=(\hat{a}_{in,1}, \hat{a}_{in,2}, \ldots, \hat{a}_{in,N})$ are column vectors representing the annihilation operators of all the N input modes and all the N output modes respectively (with the annihilation operator for mode i satisfying the standard commutation relations $[\hat{a}_i, \hat{a}_i^\dagger]=1$ and $[\hat{a}_i, \hat{a}_j]=\delta_{i,j}$).

The transformation matrices may describe the respective couplings of the pairs of modes of electromagnetic radiation in any suitable and desired way. In one embodiment each transformation matrix, describing the coupling between modes m and n (m<n), may be expressed as a reflectivity (e.g. in a beam splitter) of $\cos\theta$ ($\theta\in[0,\pi/2]$) and a phase shift (e.g. in a beam splitter or separate phase shifter) of $\phi$ ($\phi\in[0,2\pi]$) at input m. Thus, preferably each transformation matrix can be written as an N×N matrix $\hat{T}_{m,n}(\theta,\phi)$, which is identity except for the (m,m), (m,n), (n,m) and (n,n) elements, that form a 2×2 sub-matrix that performs the transformation:

$$\begin{bmatrix}\hat{a}_{m,out}\\\hat{a}_{n,out}\end{bmatrix}=\begin{bmatrix}e^{i\phi}\cos\theta & -\sin\theta\\e^{i\phi}\sin\theta & \cos\theta\end{bmatrix}\begin{bmatrix}\hat{a}_{m,in}\\\hat{a}_{n,in}\end{bmatrix}$$

In a preferred embodiment, the transformation to be performed by the interferometer comprises a transformation of the N modes from the N inputs to the N outputs of the interferometer. Preferably the transformation is a universal transformation.

However, the Applicant has also appreciated that the transformation to be performed by the interferometer may comprise a linear transformation. Such a linear transformation may be defined in a unitary matrix (as will be described below), with the unitary matrix then being decomposed according to the method of the present invention. When the transformation is a linear transformation the number of modes input into the interferometer may not be the same as the number of modes output from the interferometer.

Furthermore, for the transformation to be defined in a unitary matrix, the maximum of the number of modes input into the interferometer and the number of modes output from the interferometer is N/2 (i.e. N is even when the linear transformation is defined in an N×N unitary matrix). Thus, although the interferometer will initially be set up with N inputs and N outputs, not all of these will be used (i.e. a maximum of N/2 of each will be used).

In order to define a linear transformation in a unitary matrix, preferably a sub-matrix is defined describing the linear (N/2–N/2) transformation (where N/2 is the maximum of the number of modes input into the interferometer and the number of modes output from the interferometer), wherein the sub-matrix is embedded in an N×N unitary matrix.

In a preferred embodiment, for a linear transformation between a set of P input modes and Q output modes (where P and Q are natural numbers), an R×R sub-matrix A may be defined describing the linear transformation (where R is the maximum of P and Q and dummy elements may be added to the matrix A if P and Q are not equal so that the matrix A is square), for embedding in the unitary matrix. The matrix A is preferably normalised (such that |A|<1, with respect to the spectral norm) before embedding in the unitary matrix.

The matrix unitary A may be embedded in the unitary matrix U in any suitable and desired way. In a preferred embodiment the unitary matrix U is defined as $$U_A := \begin{pmatrix} A & (1_n - AA^\dagger)^{1/2} \\ (1_n - AA^\dagger)^{1/2} & -A^\dagger \end{pmatrix}$$

Once defined, the unitary matrix U may be treated, i.e. decomposed, in the manner described for the other aspects and embodiments of the invention.

Once the unitary matrix has been received, it is operated on by a plurality of transformation matrices to decompose the unitary matrix into a diagonal matrix in any suitable and desired way such that the transformation matrices are arranged to operate on the unitary matrix in an order that matches a sequence in which the crossing points in the interferometer may be arranged. Thus preferably the method comprises determining the plurality of transformation matrices to decompose the unitary matrix into a diagonal matrix (wherein the transformation matrices used to decompose the unitary matrix each represent the coupling between a pair of modes at a crossing point of a pair of waveguides, and wherein the transformation matrices are arranged to operate on the unitary matrix in an order that matches a sequence in which the crossing points in the interferometer may be arranged).

Formulated algebraically, the unitary matrix $\hat{U}$ is preferably decomposed into a product of a plurality of $\hat{T}_{m,n}$ matrices that satisfy $$\hat{U} = \hat{D} \prod_{(m,n)\in S} \hat{T}_{m,n}$$

where S defines the ordered sequence in which the $\hat{T}_{m,n}$ matrices are to be applied to the unitary matrix $\hat{U}$ in turn and $\hat{D}$ is the resultant diagonal matrix (with modulus equal to one on the diagonal, i.e. the elements may be complex). The physical interferometer preferably comprises a plurality of beam splitters and phase shifters arranged in the ordered configuration determined by S, with the different values of $\theta$ and $\phi$ as determined by the plurality of $\hat{T}_{m,n}$ matrices. (It should be noted that $\hat{D}$ may be physically irrelevant for many applications; however it may be implemented in the interferometer by phase shifts on one or more of the modes at the, e.g., outputs of the interferometer.)

Thus, for the layout of the interferometer as described above (i.e. in which the waveguides are arranged to cross each modes with each of the other modes at the respective crossing points, with pairs of adjacent modes being arranged to cross at N groups of crossing points, and at a group of crossing points, the maximum number of pairs of modes are crossed, provided that none of the pairs of modes has been crossed in the previous group of crossing points), the sequence in which the transformation matrices (representing the interactions between the pairs of modes at the respective crossing points) are applied to the unitary matrix to effect its decomposition matches a sequence (i.e. an order) in which pairs of adjacent modes (corresponding to the respective transformation matrices that represent the interactions between the respective pairs of modes at the crossing points) may be coupled with each other. In other words, if adjacent pairs of modes are coupled in the sequence matching the sequence in which the corresponding transformation matrices are applied to the unitary matrix to effect its decomposition, this will result in the layout of the interferometer satisfying the above described conditions.

(It should be noted that the transformation matrices may be applied to either side of the unitary matrix. Transformation matrices applied to one side, e.g. the right hand side of the unitary matrix, correspond to crossing the modes working from the input side of the interferometer towards the output side. Transformation matrices applied to the other side, e.g. the left hand side of the unitary matrix, correspond to crossing the modes working from the output side of the interferometer towards the input side.)

The sequence (or order) in which the unitary matrix is operated on by the transformation matrices may also be described by the effect the operation of each transformation matrix has on the unitary matrix (strictly the effect of each subsequent transformation matrix on the unitary matrix having been operated on by the previous transformation matrices). Thus, in a preferred embodiment the method comprises operating on the unitary matrix with the plurality of transformation matrices, wherein the operation of each transformation matrix on the unitary matrix nulls a respective (different) non-diagonal element of the unitary matrix. This thus also helps to define the transformation matrices, e.g. the transformation matrix necessary to apply to the unitary matrix at each step in order to null the desired element of the unitary matrix preferably acts on the pair of rows (if a transformation matrix operates on the unitary matrix from the left) or the pair of columns (if a transformation matrix operates on the unitary matrix from the right) that correspond to the pair of modes being coupled.

Also the transformation matrix necessary to apply to the unitary matrix at each step in order to null the desired element of the unitary matrix preferably nulls the element corresponding to the breaking of a path between the position of a mode from the input side of the interferometer and the position of a mode from the output side of the interferometer (e.g. once the pair of modes corresponding to the action of the transformation matrix have been crossed (and thus coupled) there is no longer a path (from the input side of the interferometer to the output side) between the modes in the positions corresponding to the element of the unitary matrix that is nulled), given the crossings of the modes already performed by the application of the previous transformation matrices.

Expressed algebraically, the application of a transformation matrix $\hat{T}_{i,j}$ to the unitary matrix (or the partially decomposed unitary matrix) in order to null an element (k,l) of the unitary matrix (or the partially decomposed unitary matrix) preferably corresponds to the coupling of modes i and j and the breaking of the path between the modes at positions k (towards the output side) and l (towards the input side) of the interferometer.

The sequence in which the elements of the unitary matrix are nulled may be in any suitable and desired order (corresponding to a sequence in which the crossing points in the interferometer may be arranged). In a preferred embodiment the elements of the lower triangle (or alternatively the upper triangle) of the unitary matrix are nulled to decompose the unitary matrix. It will be appreciated that by virtue of its unitarity, once all the elements in the lower or upper triangle of the unitary matrix have been nulled, the unitary matrix has been diagonalised.

Preferably the elements of the lower (or upper) triangle of the unitary matrix are nulled in an order such that a triangle of increasing size of nulled elements (i.e. with the hypotenuse parallel to the main diagonal of the unitary matrix) is formed until the whole of the lower (or upper) triangle has been nulled. Thus, for example, the triangle of nulled elements initially has one nulled element, then three nulled elements, then six nulled elements, then ten nulled elements, etc., depending on the size of the unitary matrix.

The initial element nulled in the lower (or upper) triangle of the unitary matrix may be any suitable and desired element. In a preferred embodiment the initial element nulled is the bottom left hand corner element in the lower triangle (or the top right hand corner element in the upper triangle) of the unitary matrix. In this embodiment preferably a triangle of nulled elements is formed that increases in size towards the main diagonal of the unitary matrix.

When expanding a triangle of nulled elements in the lower (or upper) triangle of the unitary matrix, these elements may be nulled in any suitable and desired order (corresponding to a sequence in which the crossing points in the interferometer may be arranged) once the first element has been nulled. In a preferred embodiment the next element to be nulled is an element adjacent (i.e. in the adjacent row and/or column) the element that has been nulled previously. Thus preferably elements are nulled along a diagonal (the hypotenuse of the expanding triangle) in one direction and then along the diagonal (hypotenuse) of the next triangle in the opposite direction.

Expressed algebraically, when the initial element nulled is the bottom left hand corner element in the lower triangle of the unitary matrix (or the top right hand corner element in the upper triangle, in which case the corresponding elements in the upper triangle will be nulled), preferably the order in which the elements of the unitary matrix are nulled, for an N×N unitary matrix $\hat{U}$ is:

---
for i from 1 to N−1:
    when i is odd:
        looping over j from 0 to i−1:
            null element (N−j,i−j);
    when i is even:
        looping over j from 1 to i:
            null element (N+j−i,j).
---

Similarly, when the initial element nulled is the bottom left hand corner element in the lower triangle of the unitary matrix (or the top right hand corner element in the upper triangle, in which case the corresponding transformation matrices will be applied to null the corresponding elements in the upper triangle), preferably the order in which the transformation matrices are applied to the unitary matrix, for an N×N unitary matrix U is:

---
for i from 1 to N−1:
    when i is odd:
        looping over j from 0 to i−1:
            multiply $\hat{U}$ (updated from the previous step) from the right with a $\hat{T}_{i-j,i-j+1}^{-1}$ matrix;
    when i is even:
        looping over j from 1 to i:
            multiply $\hat{U}$ (updated from the previous step) from the left with a $\hat{T}_{N+j-i-1,N+j-i}$ matrix.
---

Thus, in a particular preferred embodiment, when the initial element nulled is the bottom left hand corner element in the lower triangle of the unitary matrix (or the top right hand corner element in the upper triangle, in which case the corresponding transformation matrices will be applied to null the corresponding elements in the upper triangle), the order in which the elements of the unitary matrix are nulled and the order in which the transformation matrices are applied to the unitary matrix, for an N×N unitary matrix $\hat{U}$ is:

```
for i from 1 to N-1:
    when i is odd:
        looping over j from 0 to i-1:
            null element (N-j,i-j) by multiplying Û (updated from
            the previous step) from the right with a T̂_{i-j,i-j+1}^{-1}
            matrix;
    when i is even:
        looping over j from 1 to i:
            null element (N+j-i,j) by multiplying Û (updated from
            the previous step) from the left with a T̂_{N+j-i-1,N+j-i}
            matrix.
```

Once the determined transformation matrices have all been applied to the unitary matrix in order to decompose the unitary matrix into a diagonal matrix, the diagonalised matrix may be expressed in the form:

$$\left(\prod_{(m,n)\in S_L} \hat{T}_{m,n}\right)\hat{U}\left(\prod_{(m,n)\in S_R} \hat{T}_{m,n}^{-1}\right) = \hat{D}$$

where $\hat{D}$ is the resultant diagonal matrix corresponding to single mode phases, and $S_L$ and $S_R$ are the respective orderings of the (m,n) indices for the $\hat{T}_{m,n}$ and $\hat{T}_{m,n}^{-1}$ matrices yielded from the decomposition.

The decomposition of the unitary matrix may also be expressed as:

$$\hat{U} = \left(\prod_{(m,n)\in S_L^T} \hat{T}_{m,n}^{-1}\right)\hat{D}\left(\prod_{(m,n)\in S_R^T} \hat{T}_{m,n}\right)$$

Furthermore, a matrix $\hat{D}'$ may be found (such that $\hat{T}_{m,n}^{-1} = \hat{D}'\hat{T}_{m,n}$) such that the unitary matrix may be expressed as $$\hat{U} = \hat{D}'\left(\prod_{(m,n)\in S} \hat{T}_{m,n}\right)$$

where S is, by construction, the order of the crossing points of the modes through the interferometer.

The above describes a particularly preferred implementation of how the unitary matrix, which describes the overall desired transformation of the, e.g. N, modes by the interferometer between its inputs and its outputs, may be decomposed into a diagonal matrix, such that the transformation matrices correspond to couplings between modes at crossing points in the interferometer, in a matching order. It will be appreciated that a number of other implementations are possible within the scope of the invention. In particular, if the input and output modes are labelled differently (such that the unitary matrix to describe the overall transformation may need to be defined differently), then in order for the unitary matrix to be decomposed into a diagonal matrix by transformation matrices that are applied in an order that matches a possible sequence of the crossing points of modes through the interferometer, one or more of: the initial element of the unitary matrix that is nulled, the order in which the elements of the unitary matrix that are nulled, the rows and/or columns that the transformation matrices manipulate at each step and the order in which the transformation matrices are applied, may differ accordingly.

Once the unitary matrix has been decomposed and thus the transformation matrices have been determined, the coupling for the pair of modes at each of the plurality of crossing points may be determined, e.g. as outlined above. Preferably the method comprises the step of outputting the determined couplings for the pairs of modes at each of the plurality of crossing points. These determined couplings may be stored, e.g. for future use in designing and manufacturing the interferometer. This may be suitable when the design of the interferometer is determined in advance of and in a different location to the manufacture of the interferometer.

The determined couplings may be used in designing and manufacturing the interferometer in any suitable and desired way. For example, when the interferometer comprises (re) configurable beam splitters and/or phase shifters preferably the method comprises configuring the beam splitters and/or phase shifters to provide the determined coupling for the pair of modes at each of the plurality of crossing points.

Preferably the method comprises the step of designing and, e.g. manufacturing, the interferometer using the determined couplings for the pair of modes at each of the plurality of crossing points (i.e. to provide an interferometer having the determined couplings for the pair of modes at each of the plurality of crossing points). Alternatively or additionally the method comprises the steps of configuring and/or assembling an interferometer using the determined couplings for the pair of modes at each of the plurality of crossing points, e.g. configuring and/or assembling the plurality of crossing points of the interferometer such that they have the respective determined couplings for the pair of modes at each of the plurality of crossing points.

The interferometer may be designed and manufactured in any suitable and desired way, e.g. depending on the wavelength of the modes of electromagnetic radiation to be transformed by the interferometer. Thus, for example, when the electromagnetic radiation has an optical or infrared wavelength (e.g. between 400 nm and 700 nm or between 700 nm and 1600 nm), the waveguides may comprise optical fibres. However, in a preferred embodiment the interferometer comprises (i.e. is designed and manufactured using) an integrated circuit, with the plurality of waveguides and the plurality of crossing points arranged in the integrated circuit.

As will be appreciated the interferometer (e.g. designed, configured, manufactured and/or assembled using the method of the invention) will generally comprise:

- N inputs for inputting N modes of electromagnetic radiation into the interferometer,
- N outputs for outputting N modes of electromagnetic radiation from the interferometer, and
- a plurality of waveguides arranged to pass through the interferometer to connect the N inputs to the N outputs and for carrying the N modes of electromagnetic radiation through the interferometer.

Preferably the integrated circuit comprises a semiconductor-based integrated circuit. The (e.g. semiconductor-based) integrated circuit may be manufactured from any suitable and desired material, e.g. silicon, lithium niobate, silica, silicon nitride or gallium arsenide. In a preferred embodiment the (e.g. semiconductor-based) integrated circuit (e.g. a photonics chip) is a silica-on-silicon integrated circuit.

Preferably the interferometer (e.g. the integrated circuit) is configured to be compatible for use with optical fibres. For example, preferably the N inputs and the N outputs of the interferometer are configured to be connectable to respective optical fibres for carrying the N modes of electromagnetic radiation to the N inputs and from the N outputs.

The method may be performed in any suitable and desired way and on any suitable and desired platform. In a preferred embodiment the method is a computer implemented method, e.g. the steps of the method are performed by processing circuitry.

The methods in accordance with the present invention may be implemented at least partially using software e.g. computer programs. It will thus be seen that when viewed from further embodiments the present invention provides computer software specifically adapted to carry out the methods herein described when installed on a data processor, a computer program element comprising computer software code portions for performing the methods herein described when the program element is run on a data processor, and a computer program comprising code adapted to perform all the steps of a method or of the methods herein described when the program is run on a data processing system.

The present invention also extends to a computer software carrier comprising such software arranged to carry out the steps of the methods of the present invention. Such a computer software carrier could be a physical storage medium such as a ROM chip, CD ROM, RAM, flash memory, or disk, or could be a signal such as an electronic signal over wires, an optical signal or a radio signal such as to a satellite or the like.

It will further be appreciated that not all steps of the methods of the present invention need be carried out by computer software and thus from a further broad embodiment the present invention provides computer software and such software installed on a computer software carrier for carrying out at least one of the steps of the methods set out herein.

The present invention may accordingly suitably be embodied as a computer program product for use with a computer system. Such an implementation may comprise a series of computer readable instructions either fixed on a tangible, non-transitory medium, such as a computer readable medium, for example, diskette, CD ROM, ROM, RAM, flash memory, or hard disk. It could also comprise a series of computer readable instructions transmittable to a computer system, via a modem or other interface device, over either a tangible medium, including but not limited to optical or analogue communications lines, or intangibly using wireless techniques, including but not limited to microwave, infrared or other transmission techniques. The series of computer readable instructions embodies all or part of the functionality previously described herein.

Those skilled in the art will appreciate that such computer readable instructions can be written in a number of programming languages for use with many computer architectures or operating systems. Further, such instructions may be stored using any memory technology, present or future, including but not limited to, semiconductor, magnetic, or optical, or transmitted using any communications technology, present or future, including but not limited to optical, infrared, or microwave. It is contemplated that such a computer program product may be distributed as a removable medium with accompanying printed or electronic documentation, for example, shrink wrapped software, preloaded with a computer system, for example, on a system ROM or fixed disk, or distributed from a server or electronic bulletin board over a network, for example, the Internet or World Wide Web.

Preferably the invention also extends to an interferometer (e.g. an integrated photonics chip) designed and manufactured according to the method outlined above, as well as a method of manufacturing an interferometer according to the method outlined above, e.g. including the step of manufacturing the interferometer using the determined couplings for the pairs of modes at each of the plurality of crossing points.

As will be appreciated by those skilled in the art, these aspects of the present invention can, and preferably do, include any one or more or all of the preferred and optional features of the present invention discussed herein, as appropriate.

It will be appreciated that the method of matrix decomposition outlined above may be suitable not only for decomposing a unitary matrix describing the transformation of modes by an interferometer, but in other complex systems that involve multiple interacting modes for which an overall transformation of the modes is desired to be implemented by couplings between pairs of modes in the system. In particular, the Applicant envisages that such a method of matrix decomposition may be suitable for use in any quantum system (e.g. trapped ions or superconducting circuits), e.g. that undergoes controllable unitary evolution described by beam splitter-like operations. The method may also be suitable for other systems that have multiple inputs and multiple outputs, such as radio technologies and photonic beamformers, both of which require calculations of input-output relations described by matrices similar to those outlined above. Photonic circuits corresponding to the above described architecture may also have applications for designing integrated silicon photonic circuits.

Thus when viewed from a further broad aspect the invention provides a method of determining the physical couplings between a plurality of modes in a system, the method comprising:

for a system comprising:
N modes,
a plurality of interaction points at which pairs of the plurality of modes couple with each other,
wherein:
N is a natural number,
the plurality of interaction points are arranged such that each of the N modes is capable of coupling with each of the other modes respective interaction points, and
the plurality of interaction points are arranged into N groups, wherein each group contains the maximum number of possible interactions points between pairs of modes, and wherein the interaction points in each group involve pairs of adjacent modes that were not interacted in the previous group of interaction points:
receiving a unitary matrix describing a desired overall transformation to be performed by the system;
operating on the unitary matrix with a plurality of transformation matrices to decompose the unitary matrix into a diagonal matrix, wherein the transformation matrices used to decompose the unitary matrix each represent the coupling between a pair of modes at an interaction point, and wherein the transformation matrices are arranged to operate on the unitary matrix in an order that matches a sequence in which the interaction points in the system may be arranged;
determining, using the transformation matrices, the coupling for the pair of modes at each of the plurality of interaction points for use in designing the system.

As will be appreciated by those skilled in the art, this aspect of the present invention can, and preferably does, include any one or more or all of the preferred and optional features of the present invention discussed herein, as appropriate.

Certain preferred embodiments of the invention will now be described, by way of example only, with reference to the accompanying drawings in which:

FIGS. 3a-3e show the steps of decomposing a unitary matrix and the corresponding couplings that are introduced between the modes of an interferometer according to an embodiment of the present invention;

FIG. 6 shows the order in which the matrix elements of the unitary matrix are nulled according to another embodiment of the present invention.

There are many applications in which we might want to interfere modes of light, such as in a photonics chip, radio-frequency interferometers and quantum systems that undergo controllable unitary or linear evolution described by beam splitter-like operations.

This particular embodiment of the present invention may be useful for interfering modes of light in an N×N interferometer, where N is the number of modes of light, to produce an arbitrary interference pattern. As will become apparent, this embodiment of the invention provides a means for determining the reflection coefficients and phase shifts of an interferometer for creating an arbitrary interference pattern.

Figure 1:
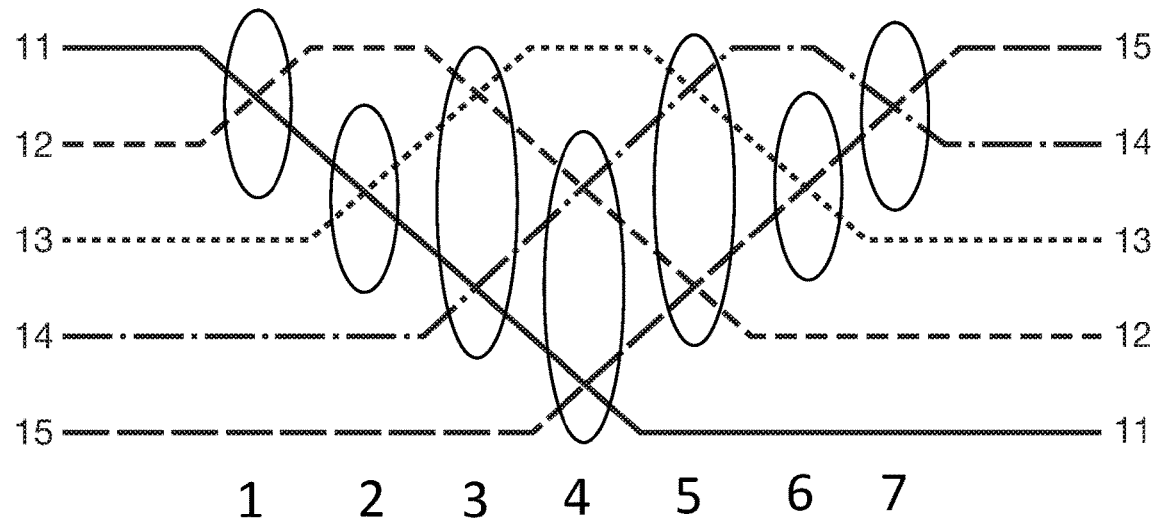
FIG. 1 shows a schematic of a layout of an interferometer.
Figure 2:
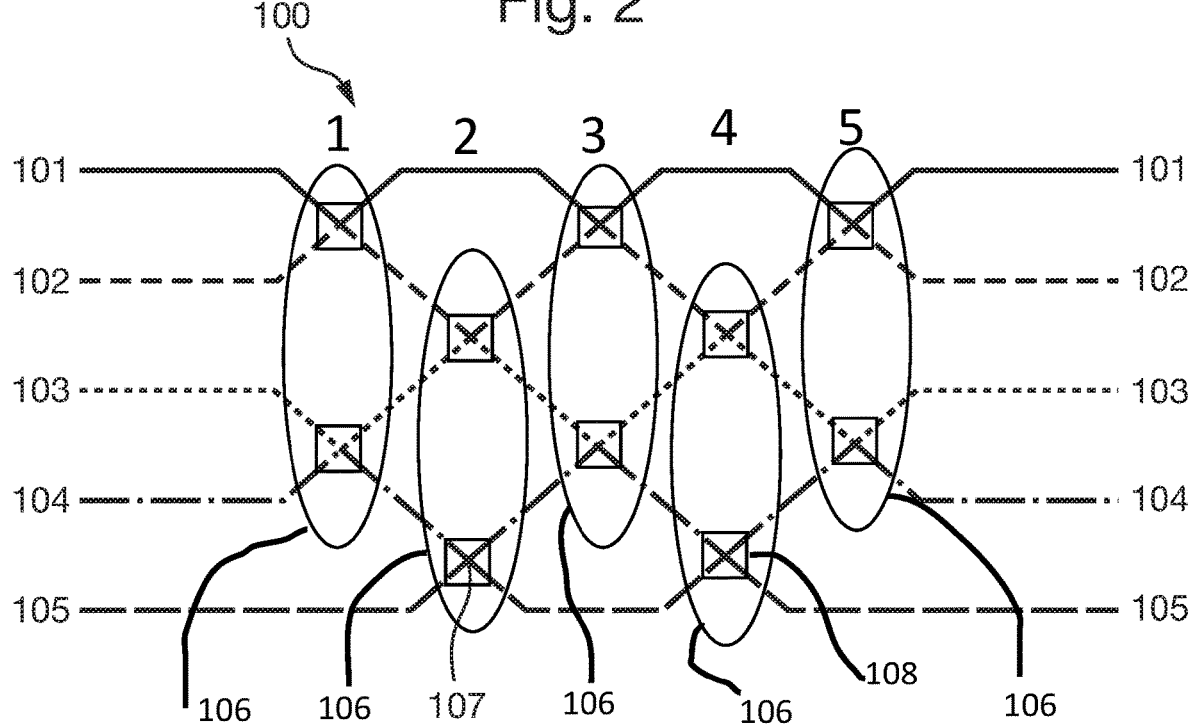
FIG. 2 shows a schematic diagram of the layout of an interferometer according to an embodiment of the invention.

FIG. 2 shows a schematic diagram of the layout of an interferometer 100 that is arranged to interfere the paths 101, 102, 103, 104 and 105 of five modes of light along the length of the interferometer. FIG. 2 illustrates an embodiment of this invention for an interferometer with N=5 modes of light for purposes of clarity and simplicity. In practice N may be much larger, for example, approximately one hundred, or orders of magnitude greater.

The interferometer in FIG. 2 includes five inputs and five outputs, the inputs matching one to one with the outputs via five paths through the interferometer. The five paths are arranged to carry five respective modes of light through the interferometer along which each mode of light passes through a series of beam splitters. The paths 101, 102, 103, 104 and 105 are arranged to cross each other in the beam splitter 108 at crossing points between two paths such that each mode of light at the input is systematically interfered with every other mode of light by means of the beam splitters. Thus it will be seen that the crossing points are arranged into five groups 106 along the waveguide from the inputs to the outputs. The paths and the beam splitters are arranged in the topography shown in FIG. 2. For example, a beam splitter 108 is located at position 107, where two paths, 104 and 105, cross and their respective modes are interfered.

A phase shift is applied before each beam splitter 108 by means of a phase-shifting device to at least one mode of light. A minimum of N(N−1)/2 beam splitters are required to interfere all the modes of light in an N×N interferometer; 10 beam splitters are used in the 5×5 interferometer illustrated in FIG. 2.

By selecting the reflectivity coefficient of each of the beam splitters 108, and selecting the phase shifts applied to the modes of light before each beam splitter 108, the interferometer can be used to create any arbitrary interference pattern.

Using an embodiment of the invention, a desired interference pattern can be converted into a design for the arrangement of: the order of interference of N modes of light in an interferometer; the reflection coefficient applied at each interference point; and the phase shift applied before at the interference point to one or both of the modes of light.

A beam splitter having reflectivity $\cos\theta$ ($\theta\in[0,2\pi]$) on modes labelled m and n (m<n) at input m, with a phase shift, $\phi$ at input m, can be written as an N×N matrix $\hat{T}_{m,n}(\theta, \phi)$ which is the identity matrix except for the (m, m), (m, n), (n, m), (n, n) elements, which form a 2×2 submatrix effecting the following transformation:

$$\begin{bmatrix} \hat{a}_{m,out} \\ \hat{a}_{n,out} \end{bmatrix} = \begin{bmatrix} e^{i\phi}\cos\theta & -\sin\theta \\ e^{i\phi}\sin\theta & \cos\theta \end{bmatrix} \begin{bmatrix} \hat{a}_{m,in} \\ \hat{a}_{n,in} \end{bmatrix}$$

A property of the $\hat{T}_{m,n}(\theta, \phi)$ matrices is that for any $\hat{U}$, there are specific values of $\theta$ and $\phi$ that null the (m,n) element of matrix $\hat{U}\hat{T}_{m,n}(\theta,\phi)$. For notational simplicity, the explicit dependence of the $\hat{T}_{m,n}(\theta, \phi)$ matrices on $\theta$ and $\phi$ is omitted in the below description.

A further matrix used in the decomposition are matrices represented by $\hat{T}_{m,n}^{-1}(\theta, \phi)$. A matrix $\hat{T}_{m,n}^{-1}(\theta, \phi)$ is the inverse of a matrix $\hat{T}_{m,n}(\theta, \phi)$. $\hat{T}_{m,n}^{-1}(\theta, \phi)$ is identity except for the (m, m), (m, n), (n, m), (n, n) elements, which form a 2×2 submatrix effecting the following transformation:

$$\begin{bmatrix} \hat{a}_{m,out} \\ \hat{a}_{n,out} \end{bmatrix} = \begin{bmatrix} e^{-i\phi}\cos\theta & e^{-i\phi}\sin\theta \\ -\sin\theta & \cos\theta \end{bmatrix} \begin{bmatrix} \hat{a}_{m,in} \\ \hat{a}_{n,in} \end{bmatrix}$$

The $\hat{T}_{m,n}^{-1}$ matrices can null the (m,n) element of the matrix $\hat{T}_{m,n}^{-1}(\theta, \phi)\hat{U}$. As with the $\hat{T}_{m,n}$ matrices, the explicit dependence on $\theta$ and $\phi$ in the $\hat{T}_{m,n}^{-1}(\theta, \phi)$ matrices will be omitted for simplicity.

$\hat{T}_{m,n}^{-1}$ matrices represent a physical implementation of a beam splitter of reflectivity $\cos\theta$ with a phase shift $-\phi$ at input m (as opposed to output m for the $\hat{T}_{m,n}$ matrices). The inverse of any $\hat{T}_{m,n}$ matrix is a $\hat{T}_{m,n}^{-1}$ matrix.

A given N-mode interferometer can be represented by an N×N unitary matrix $\hat{U}$ that describes the transformation of the annihilation operators of the modes of light by means of the equation $$\hat{a}_{out} = \hat{U}\hat{a}_{in}$$

where $\hat{a}_{out} = (\hat{a}_{out,1}, \hat{a}_{out,2}, \ldots, \hat{a}_{out,N})$ and $\hat{a}_{in} = (\hat{a}_{in,1}, \hat{a}_{in,2}, \ldots, \hat{a}_{in,N})$ are vectors representing the annihilation operators of all the input and output modes, i.e. $\hat{U}$ describes the desired interference pattern to be achieved by the interferometer. Thus first a desired matrix $\hat{U}$ is defined to reflect the desired interference pattern.

The decomposition of the unitary matrix $\hat{U}$ will now be described for a general N×N interferometer having N inputs and N outputs. Thereafter, this method will then be applied to the specific example shown in FIGS. 3a-3e. FIGS. 3a-3e show the steps of decomposing the unitary matrix $\hat{U}$ and the corresponding couplings that are introduced between the modes 101, 102, 103, 104, 105 of the interferometer 100, 203.

Once the matrix $\hat{U}$ has been defined, the reflectivity coefficient of each of the beam splitters and the phase shift applied at each phase shifter can be calculated by decomposing $\hat{U}$. Decomposing $\hat{U}$ into a series of simpler matrices, where each matrix represents a single 2×2 beam splitter, allows an N×N interferometer to be described with at most N(N−1)/2 beam splitters with one or two phase shifters associated with each beam splitter.

The decomposition finds, for a given N, that the $\hat{U}$ matrix can be written as $$\hat{U} = \hat{D}\left(\prod_{(m,n)\in S} \hat{T}_{m,n}\right)$$

where the θ and φ values of the $\hat{T}_{m,n}^{-1}$ matrices depend on $\hat{U}$, Π is the product operator, S defines a specific ordered sequence of two-mode transformations and $\hat{D}$ is a diagonal matrix with complex elements with modulus equal to one on the diagonal.

An interferometer composed of beam splitters and phase shifters in the configuration defined by S, with values defined by the θ and φ in the $\hat{T}_{m,n}^{-1}$ matrices, will implement transformation $\hat{U}$. $\hat{D}$ can be implemented in an interferometer by phase shifts on all individual modes at the output of the interferometer.

Figure 4:
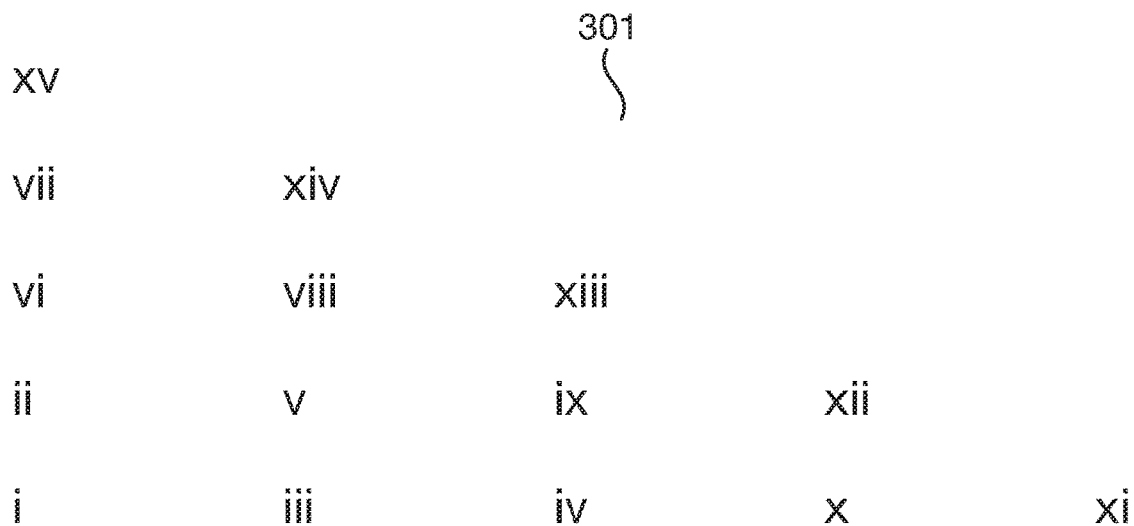
FIG. 4 shows the order in which the matrix elements of the unitary matrix are nulled according to an embodiment of the present invention.

The unitary matrix decomposition procedure is implemented by consecutively nulling elements of $\hat{U}$ using $\hat{T}_{m,n}^{-1}$ and $\hat{T}_{m,n}^{-1}$ matrices. FIG. 4 shows the order in which the matrix elements are nulled by the triangle 301.

The numerical value in each element (given in Roman numerals) of the triangle 301 indicates the ordering of the nulling is this embodiment of the invention. The first element to be nulled is at the bottom left of the matrix. The following elements are then nulled in consecutive diagonals. An underlined element in FIG. 4 located in row i of the matrix is nulled with a $\hat{T}_{i-1,i}$. An element which is not underlined in FIG. 4 is nulled with a $\hat{T}_{i,i+1}^{-1}$ matrix.

For each row i from 1 to N−1, if i is odd then for each column, j, between 0 and i−1 find a $\hat{T}_{i-j,i-j+1}^{-1}$ matrix that nulls element (N−j, i−j) of $\hat{U}$. After each null operation for an odd i, $\hat{U}$ is updated such that $\hat{U}=\hat{U}\hat{T}_{i-j,i-j+1}^{-1}$. If i is even then for each j from 1 to i find a $\hat{T}_{N+j-i-1,N+j-i}$ matrix that nulls element (N+j−i, j) of $\hat{U}$. After each null operation for an even i, $\hat{U}$ is updated such that $\hat{U}=\hat{T}_{N+j-i-1,N+j-i}\hat{U}$.

The decomposition yields an equation $$\left(\prod_{(m,n)\in S_L} \hat{T}_{m,n}\right)\hat{U}\left(\prod_{(m,n)\in S_R} \hat{T}_{m,n}^{-1}\right) = \hat{D}$$

where $S_L$ and $S_R$ are the respective orderings of the (m, n) indices for the $\hat{T}_{m,n}$ or $\hat{T}_{m,n}^{-1}$ matrices yielded by our decomposition. This can be rewritten as $$\hat{U} = \left(\prod_{(m,n)\in S_L^T} \hat{T}_{m,n}^{-1}\right)\hat{D}\left(\prod_{(m,n)\in S_R^T} \hat{T}_{m,n}\right) \quad (1)$$

If $\hat{D}$ consists of single-mode phase shifts, then for any $\hat{T}_{m,n}^{-1}$ matrix one can find a $\hat{D}'$ matrix of single mode phase-shifts and a $\hat{T}_{m,n}'$ matrix such that $\hat{T}_{m,n}^{-1}\hat{D}=\hat{D}'\hat{T}_{m,n}'$, hence Equation (1) can be rewritten as $$\hat{U} = \hat{D}'\left(\prod_{(m,n)\in S} \hat{T}_{m,n}'\right)$$

Figure 3E:
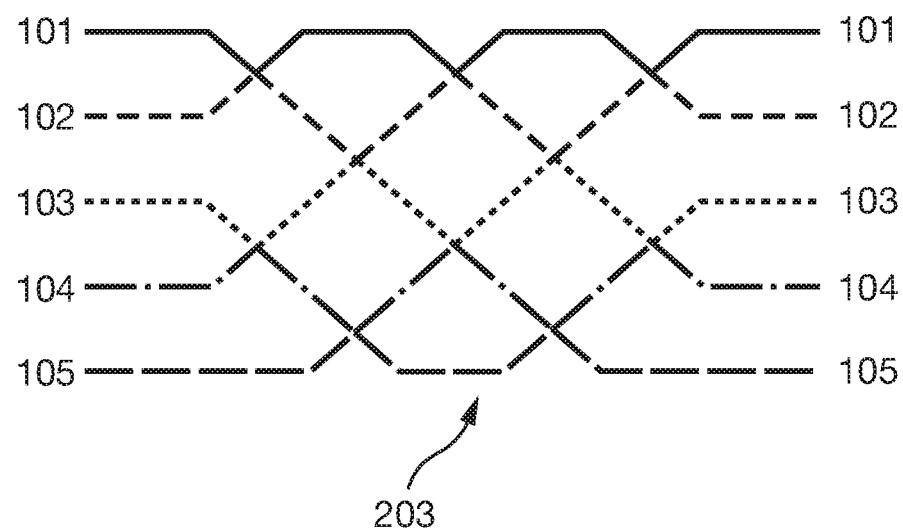

This decomposition is illustrated in FIGS. 3a-3e for a 5×5 interferometer. The decomposition starts with a random 5×5 unitary matrix $\hat{U}$, 201, and a blank interferometer, 203, shown in FIG. 3a. Elements in the random 5×5 unitary matrix $\hat{U}$, 201, are represented by asterisk symbols. The bottom left element of $\hat{U}$, 201, is the first one nulled, with a $\hat{T}_{1,2}^{-1}$, which causes the first two columns of $\hat{U}$ to mix. This corresponds to adding the top-left beam splitter in the interferometer, i.e. to couple the top two modes 101, 102 in the interferometer 203. Successive elements of $\hat{U}$, 201, are nulled in the order given by the triangle 301 in FIG. 4. This is shown in FIGS. 3b-3e, with a sequence of $\hat{T}_{m,n}$ and $\hat{T}_{m,n}^{-1}$ matrices 205 which operate on $\hat{U}$, 201, to null the respective elements. In FIG. 3e, $\hat{U}$, 201, is a lower triangular matrix, which by virtue of its unitarity is diagonal. The sequence of $\hat{T}_{m,n}$ and $\hat{T}_{m,n}^{-1}$ matrices 205 and $\hat{U}$, 201, given in FIG. 3e can be rewritten as $\hat{U}=D'T_{3,4}T_{4,5}T_{1,2}T_{2,3}T_{3,4}T_{4,5}T_{1,2}T_{2,3}T_{3,4}T_{1,2}$.

Alternative embodiments of the present invention may be presented by relabeling modes in the interferometer or by decomposing the elements in $\hat{U}$ in a different order to that presented in FIG. 4. One such embodiment is described as follows.

Figure 5:
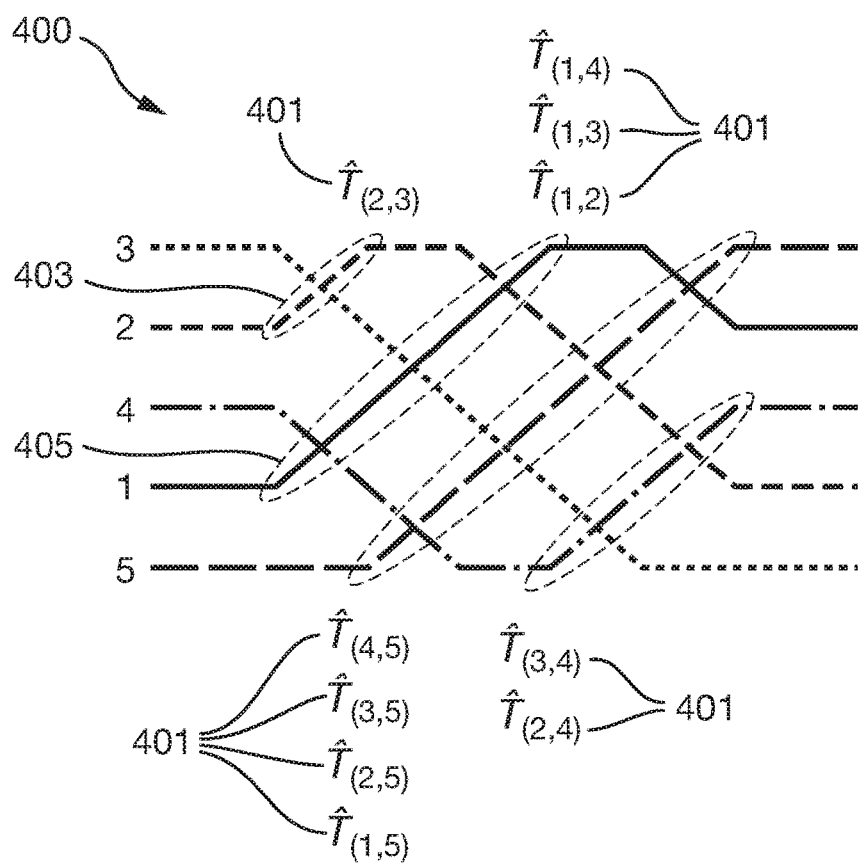
FIG. 5 shows a schematic diagram of the layout of an interferometer according to another embodiment of the invention.

FIG. 5 shows a schematic diagram of the layout of the interferometer 400 that is arranged to interfere the paths 1, 2, 3, 4 and 5 of five modes of light along the length of the interferometer. FIG. 5 illustrates an embodiment of this invention for an interferometer with N=5 modes of light for purposes of clarity and simplicity. In practice N may be much larger, for example, approximately one hundred, or orders of magnitude greater.

The interferometer in FIG. 5 includes five inputs and five outputs, the inputs matching one to one with the outputs via five paths through the interferometer. The five paths are arranged to carry five respective modes of light through the interferometer along which each mode of light passes through a series of beam splitters. The path 1, 2, 3, 4 and 5 are arranged to cross each other in the beam splitter at crossing points between two paths such that each mode of light is systematically interfered with every other mode of light by means of the beam splitters. The paths and the beam splitters are arranged in the topography shown in FIG. 5. For example, a beam splitter is located at position 405, where two paths 1, 4 cross and their respective modes are interfered.

The dashed ovals 403 help indicate the sequence of beam splitters that correspond to the ordering identified in an embodiment of the invention. The $\hat{T}_{m,n}$ matrices, 401, indicate which $\hat{T}_{m,n}$ matrix corresponds to which crossing point.

A phase shift is applied before each beam splitter by means of a phase-shifting device to at least one mode of light. A minimum of N(N−1)/2 beam splitters are required to interfere all the modes of light in an N×N interferometer; 10 beam splitters are used in the 5×5 interferometer illustrated in FIG. 5.

By selecting the reflectivity coefficient of each of the beam splitters, and selecting the phase shifts applied to the modes of light at before each beam splitter, the interferometer can be used to create any arbitrary interference pattern.

Using an embodiment of the invention, a desired interference pattern can be converted into a design for the arrangement of: the order of interference of N modes of light in an interferometer; the reflection coefficient applied at each interference point; and the phase shift applied before at the interference point to one or both of the modes of light.

A beam splitter having reflectivity cos θ (θ∈[0,2π]) on modes labelled m and n (m<n) at output m, with a phase shift, ϕ, at output m can be written as an N×N matrix $\hat{T}_{m,n}(\theta, \phi)$ which is the identity matrix except for the (m, m), (m, n), (n, m), (n, n) elements, which form a 2×2 submatrix effecting the following transformation:

$$\begin{bmatrix} \hat{a}_{m,out} \\ \hat{a}_{n,out} \end{bmatrix} = \begin{bmatrix} e^{i\phi}\cos\theta & -e^{i\phi}\sin\theta \\ \sin\theta & \cos\theta \end{bmatrix} \begin{bmatrix} \hat{a}_{m,in} \\ \hat{a}_{n,in} \end{bmatrix}$$

A property of the $\hat{T}_{m,n}(\theta, \phi)$ matrices is that for any $\hat{U}$, there are specific values of θ and ϕ that null the (m,n) element of matrix $\hat{U}\hat{T}_{m,n}(\theta,\phi)$. For notational simplicity, the explicit dependence of the $\hat{T}_{m,n}(\theta, \phi)$ matrices on θ and ϕ is omitted in the below description.

A further matrix used in the decomposition are matrices represented by $\hat{T}_{m,n}^{-1}(\theta, \phi)$. A matrix $\hat{T}_{m,n}(\theta, \phi)$ is the inverse of a matrix $\hat{T}_{m,n}(\theta, \phi)$. $\hat{T}_{m,n}^{-1}(\theta, \phi)$ are identity except for the (m, m), (m, n), (n, m), (n, n) elements, which form a 2×2 submatrix effecting the following transformation:

$$\begin{bmatrix} \hat{a}_{m,out} \\ \hat{a}_{n,out} \end{bmatrix} = \begin{bmatrix} e^{-i\phi}\cos\theta & \sin\theta \\ -e^{-i\phi}\sin\theta & \cos\theta \end{bmatrix} \begin{bmatrix} \hat{a}_{m,in} \\ \hat{a}_{n,in} \end{bmatrix}$$

The $\hat{T}_{m,n}^{-1}$ matrices can null the (m,n) element of the matrix $\hat{T}_{m,n}^{-1}(\theta, \phi)\hat{U}$. As with the $\hat{T}_{m,n}$ matrices, the explicit dependence on θ and ϕ in the $\hat{T}_{m,n}^{-1}(\theta, \phi)$ matrices will be omitted for simplicity.

$\hat{T}_{m,n}^{-1}$ matrices represent a physical implementation of a beam splitter of reflectivity cos θ with a phase shift −ϕ at input m (as opposed to output m for the $\hat{T}_{m,n}$ matrices). The inverse of any $\hat{T}_{m,n}$ matrix is a $\hat{T}_{m,n}^{-1}$ n matrix.

A given N-mode interferometer can be represented by an N×N unitary matrix $\hat{U}$ that describes the transformation of the annihilation operators of the modes of light by means of the equation $$\hat{a}_{out} = \hat{U}\hat{a}_{in}$$

where $\hat{a}_{out}=(\hat{a}_{out,1}, \hat{a}_{out,2}, \ldots, \hat{a}_{out,N})$ and $\hat{a}_{in}=(\hat{a}_{in,1}, \hat{a}_{in,2}, \ldots, \hat{a}_{in,N})$ are vectors representing the annihilation operators of all the input and output modes, i.e. $\hat{U}$ describes the desired interference pattern to be achieved by the interferometer. Thus first a desired matrix $\hat{U}$ is defined to reflect the desired interference pattern.

The decomposition of the unitary matrix $\hat{U}$ will now be described for a general N×N interferometer having N inputs and N outputs. Thereafter, this method will then be applied to the specific example shown in FIG. 5.

Once the matrix $\hat{U}$ has been defined the reflectivity coefficient of each of the beam splitters and the phase shift applied at each phase shifter, can be calculated by decomposing a matrix $\hat{U}$. Decomposing $\hat{U}$ into a series of simpler matrices, where each matrix represents a single 2×2 beam splitter, allows an N×N interferometer to be described with at most N(N−1)/2 beam splitters with one or two phase shifters associated with each beam splitter.

The decomposition finds, for a given N, a fixed sequence, S, for which any N×N $\hat{U}$ matrix can be written as $$\hat{U} = \hat{D}\left(\prod_{(m,n)\in S} \hat{T}_{m,n}^{-1}\right),$$

where the θ and ϕ values of the $\hat{T}_{m,n}^{-1}$ matrices depend on $\hat{U}$ and Π is the product operator.

The decomposition begins by nulling element (N(N+1)/2, (N−1)/2) of $\hat{U}$ if N is odd, or element (N/2+1, N/2) of $\hat{U}$ if N is even. The selected element is nulled by multiplying it by a $\hat{T}_{m,n}$ matrix on the right with the values of θ and ϕ selected so as to null the element.

To null the remainder of the elements below the diagonal of $\hat{U}$ the following operations are applied. The operation chosen at each iteration is dependent upon the coordinates, (i,j), of the last nulled element of $\hat{U}$.

If i≤N/2+1 and i−1=j, then the greatest n for which the (n, j) element has been nulled is found. Element (n+1, j) is nulled by multiplying $\hat{U}$ (and any previously included $\hat{T}_{m,n}$ and $\hat{T}_{m,n}^{-1}$ matrices) from the left by a $\hat{T}_{j,n+1}^{-1}$ matrix.

Otherwise, if j>(N−1)/2 and j+1=i, the smallest n is then found for which the (i, n) element has been nulled. Null element (i, n 1) by multiplying U (and any previously included $\hat{T}_{m,n}$ and $\hat{T}_{m,n}^{-1}$ matrices) from the right by a $\hat{T}_{n-1,i}$ matrix.

Otherwise, if (i−1, j) has not been nulled, then it is nulled by multiplying $\hat{U}$ (and any previously included $\hat{T}_{m,n}$ and $\hat{T}_{m,n}^{-1}$ matrices) from the right by a $\hat{T}_{j,i-1}$ matrix.

If none of the above conditions are fulfilled, the matrix (i,j+1) is nulled by multiplying $\hat{U}$ (and any previously included $\hat{T}_{m,n}$ and $\hat{T}_{m,n}^{-1}$ matrices) from the left by a $\hat{T}_{j,n+1}^{-1}$ matrix.

The (i,j) coordinates of the nulled element are then used to determine the next coordinate to null, using the selection criteria above.

FIG. 6 shows the order of nulling the matrix elements for an N=5 matrix according to another embodiment of the invention. The matrix 501 has already been partially-nulled to form a triangle of nulled elements below the diagonal, using the steps outlined above. Matrix 503 shows the next steps of nulling the matrix. The element immediately below the left-most column 51 of the nulled triangle is nulled first. The element immediately below the second left-most column 52 of the nulled triangle is nulled second. The element immediately below the third left-most column 53 of the nulled triangle is nulled third. The element immediately below the fourth left-most column 54 of the nulled triangle is nulled fourth. In this example the elements immediately below all the columns of the nulled-triangle in matrix 501 have now also been nulled.

The next steps are illustrated in matrix 505. The element immediately to the left of the bottom row 55 of the nulled triangle is nulled first. The element immediately to the left of the second bottom row 56 of the nulled triangle is nulled second. The element immediately to the left of the third bottom row 57 of the nulled triangle is nulled third. The element immediately to the left of the fourth bottom row 57 of the nulled triangle is nulled fourth. The element immediately to the left of the fifth bottom row 58 of the nulled triangle is nulled fifth. The element immediately to the left of the sixth bottom row 59 of the nulled triangle is nulled sixth. The nulled triangle is thereby expanded. The steps can be continued to null further rows and columns of an N×N matrix.

The decomposition yields an equation $$\left(\prod_{(m,n)\in S_L} \hat{T}_{m,n}^{-1}\right)\hat{U}\left(\prod_{(m,n)\in S_R} \hat{T}_{m,n}\right) = \hat{D},$$

where $S_L$ and $S_R$ correspond to the sequences of the beam splitter matrices used the left and right sides of $\hat{U}$, respectively, and $\hat{U}$ is a diagonal matrix with complex diagonal elements with modulus equal to one. This is equivalent to $$\hat{U}\left(\prod_{(m,n)\in S_R} \hat{T}_{m,n}\right) = \left(\prod_{(m,n)\in S_L^T} \hat{T}_{m,n}\right)\hat{D}. \quad (2)$$

Equation (2) can be rewritten as $$\hat{U} = \left(\prod_{(m,n)\in S_L^T} \hat{T}_{m,n}\right)\hat{D}\left(\prod_{(m,n)\in S_R^T} \hat{T}_{m,n}^{-1}\right). \quad (3)$$

$\hat{T}_{m,n}^{-1}$ matrices are physically implemented by a phase shift on one mode followed by a two-mode beam splitter and the $\hat{T}_{m,n}$ matrices are physically implemented by a two-mode beam splitter followed by a phase shift on one mode. $\hat{D}$ physically corresponds to additional single-mode phases on all the modes. Hence, the interferometer design given by Equation (3) can be implemented with a phase shift in between each beam splitter and at the input and output of the interferometer.

In an alternative embodiment, the interferometer may be physically implemented using phase shifts at only one input of each of the beam splitters. To determine the design for the interferometer with phase shifts at only one input of each of the beam splitters, the steps noted above to find Equation (2) should initially be followed.

It is first noted that for any given (m, n) and $\hat{T}_{m,n}$ matrix, and for any diagonal $\hat{D}$ matrix, the (m, n) element of $\hat{T}_{m,n}\hat{D}$ can be nulled by multiplying from the right by the appropriate $\hat{T}'_{m,n}$ matrix (where the prime symbol indicates a $\hat{T}_{m,n}$ matrix with different values for $\theta$ and $\phi$, such that $$\hat{T}_{m,n}\hat{D}\hat{T}'_{m,n} = \hat{D}',$$

where $\hat{D}$ is a diagonal matrix. It follows that $$\hat{T}_{m,n}\hat{D} = \hat{D}'\hat{T}'_{m,n}^{-1}. \quad (4)$$

Combining Equations (2) and (4) yields $$\hat{U}\left(\prod_{(m,n)\in S_R} \hat{T}_{m,n}\right) = \hat{D}'\left(\prod_{(m,n)\in S_L^T} \hat{T}_{m,n}^{-1}\right),$$

therefore $$\hat{U} = \hat{D}'\left(\prod_{(m,n)\in S_L^T \cup S_R^T} \hat{T}_{m,n}^{-1}\right), \quad (5)$$

where u, the union operator, preserves the ordering of $S_L^T$ and $S_R^T$. Equation (5) shows the completed decomposition for determining the reflection coefficients and phase shifts of the interferometer to achieve an arbitrary interference pattern. Hence Equation (5) yields the design for an interferometer with phase shifts at only one input of each of the beam splitters.

In some applications, phase shifts at the output of an interferometer are irrelevant. In these cases $\hat{D}'$ is physically irrelevant and phase shifts are only required at one input of every beam splitter in the interferometer.

In other applications phase shifts are used at the output of an interferometer. In these cases $\hat{D}'$ is physically relevant. This means phase shifts are applied at one input of every beam splitter in the interferometer and after the final stage of beam splitters of the interferometer for each mode of light To show how the decomposition corresponds to a physical implementation of an interferometer, Equation (5) is applied to an odd-numbered N, which yields $$\hat{U} = \hat{D}'\hat{T}_{((N+3)/2,(N-1)/2)}^{-1} \cdots \left(\prod_{n=2}^{N-2} \hat{T}_{(n,N-1)}\right) \quad (6)$$

$$\left(\prod_{n=1}^{N-1} \hat{T}_{(n,N)}\right)\left(\prod_{n=2}^{N-1} \hat{T}_{(1,n)}^{-1}\right)\left(\prod_{n=3}^{N-2} \hat{T}_{(2,n)}^{-1}\right) \cdots \hat{T}_{((N-1)/2,(N+1)/2)}^{-1},$$

where the $\hat{T}_{m,n}^{-1}$ matrices on the first line of Equation (6) are ordered according to $S_L^T$ and the $\hat{T}_{m,n}^{-1}$ matrices on the second line are ordered according to $S_R^T$.

The last term on the first line of Equation (6), $\Pi_{n=1}^{N-1}\hat{T}_{(n,N)}$, is implemented in an interferometer by crossing mode N with every other mode in the centre of the interferometer circuit, in descending order of modes. This is shown by mode 5 in FIG. 5, which shows a N=5 interferometer where mode 5 interferes with the other modes in the order 4, 3, 2 then 1.

The first term on the second line of Equation (6), $\Pi_{n=2}^{N-1}\hat{T}_{(1,n)}^{-1}$, corresponds to mode 1 crossing over every mode except N in the same order. Physically, this means that modes 1 and N are parallel to each other in the interferometer circuit, and modes 1 and N only cross over each other once they have crossed every other mode. This is shown by mode 1 in FIG. 5, which shows a N=5 interferometer where mode 1 interferes with the other modes in the order 4, 3, 2 then 5.

The penultimate term on the first line of Equation (6), $\Pi_{n=2}^{N-2}\hat{T}_{(n,N-1)}^{-1}$, corresponds to mode N−1 crossing over every mode in the same order except 1 and N. Physically, this means that mode N−1 first crosses modes 1, then N, and then goes parallel to them to cross every other mode. This is illustrated by mode 4 in FIG. 5, which shows a N=5 interferometer where mode 4 interferes with the other modes in the order 1, 5, 3 then 2.

As will be appreciated by the skilled person, this reasoning can be applied to other terms in Equation (6) as required by the value of N, giving the crossing order between each of the N modes with each of the other N modes.

It will be appreciated by the skilled person that the ordering and labelling of the modes at the input, as shown by modes 101-105 in FIGS. 2 and 1-5 in FIG. 5, can be reordered or relabeled to achieve a desired order of modes at the output Once the transformation matrices (the $\hat{T}_{m,n}$ matrices) have been determined, e.g. according to one of the above embodiments, e.g. using a computer, an interferometer can be designed and manufactured using the couplings determined from these transformation matrices. For example, in one embodiment a semi-conductor based integrated photonics circuit based interferometer is designed and manufactured having beam splitters arranged at each of the crossing points between the waveguides that carry the modes of light therethrough (e.g. in the arrangement shown in FIGS. 2-5, which are extendible to any N), with the beam splitters (e.g. Mach-Zehnder interferometers) being configured to have a reflectivity and phase shift as determined from the couplings.

Whilst the embodiments of the invention have been described with reference to the implementations shown in FIGS. 2 and 5, the skilled person will appreciate that phase shifts could be applied before, after or between the beam splitters.

In the embodiments discussed it will be seen that the nulling process may be started at two different elements in the matrix Û; however the Applicant envisages that the nulling process may start at any suitable element.

An interferometer can thus be designed for N modes of light according to the desired interference pattern (as defined by the Û matrix). The skilled person will appreciate that this could be applied to any wavelength of electromagnetic waves. The Applicants envisage that the interferometers can in particular be designed for photonic circuits.

While the embodiment described above with reference to FIG. 2 shows a preferred implementation, the Applicants envisage that a number of variations exist. For example, N could take any value over a several orders of magnitude from approximately $10^1$ to $10^6$ or greater, modes could be rearranged into any desired order, phase shifters could be placed between beam splitters, i.e. not integrated therewith, and interferometers manufactured to the design could be manufactured in any suitable and desired way, using any suitable material or materials, such as silica, silicon or lithium niobate.

In one example the interferometer is manufactured as a silica-on-silicon photonic chip designed to operate at near infrared wavelengths. The photonic chip is compatible with optical fibre technology and contains optical waveguides as well as thermo-optic phase shifters. The thermo-optic phase shifters comprise resistors placed just above the optical waveguide. The photonic chip also contains controllable beam splitters which are implemented by Mach-Zehnder interferometers that each contains a thermo-optic phase shifter. The phase shifters and variable beam splitters are computer-controlled.

The skilled person will appreciate that the above embodiments are a particularly efficient way of interfering N modes of light with one-another in a compact arrangement with a high balance of loss between the modes of light, using the minimum number of beam splitters.

Furthermore, as well as being used to implement an, e.g., universal transformation described by a unitary matrix, embodiments of the invention may be used to implement a linear transformation, described by a sub-matrix that is embedded into a unitary matrix.

(SIQS)—The work leading to this invention has received funding from the European Union Seventh Framework Programme (FP7 2007-2013) under grant agreement no. 600645.

(MOQUACINO)—The work leading to this invention has received funding from the European Research Council under the European Union's Seventh Framework Programme (FP7 2007-2013) under grant agreement no. 339918.

The invention claimed is:

1. A universal interferometer for coupling a plurality of modes of electromagnetic radiation according to a transformation, the interferometer comprising:

N inputs for inputting N modes of electromagnetic radiation into the interferometer;

N outputs for outputting N modes of electromagnetic radiation from the interferometer;

a plurality of waveguides arranged to pass through the interferometer to connect the N inputs to the N outputs and for carrying the N modes of electromagnetic radiation through the interferometer; and a plurality of reconfigurable beam splitters, wherein each reconfigurable beam splitter of the plurality of reconfigurable beam splitters is arranged to implement a reconfigurable reflectivity and a reconfigurable phase shift;

wherein:

N is a natural number;

the plurality of waveguides is arranged to provide a plurality of crossing points between pairs of adjacent waveguides of the plurality of waveguides, each crossing point of the plurality of crossing points comprises a reconfigurable beam splitter of the plurality of reconfigurable beam splitters, wherein each reconfigurable beam splitter of the plurality of reconfigurable beam splitters permits two modes of electromagnetic radiation carried by the respective pair of adjacent waveguides to the crossing point to be coupled with each other with a reconfigurable reflection coefficient and a reconfigurable phase shift coefficient, wherein the plurality of waveguides and the plurality of crossing points are arranged such that each mode of the N modes of electromagnetic radiation is capable of coupling with each of the other modes of the N modes of electromagnetic radiation at respective reconfigurable beam splitters of the plurality of reconfigurable beam splitters; and the plurality of waveguides is arranged such that the plurality of crossing points are arranged into N sequential groups of crossing points along the plurality of waveguides from the inputs to the outputs through the interferometer, wherein each group of the N sequential groups of crossing points contains the maximum possible number of crossing points between pairs of adjacent waveguides, and wherein the crossing points in each group of the N sequential groups of crossing points involve pairs of adjacent waveguides that were not crossed in the immediately previous group of crossing points; and couplings between pairs of modes at each reconfigurable beam splitter are configured such that the interferometer implements a transformation of the N modes between the N inputs and the N outputs.

2. An interferometer as claimed in claim 1, wherein the interferometer comprises an integrated circuit, and wherein the plurality of waveguides and the plurality of crossing points are arranged in the integrated circuit.

3. An interferometer as claimed in claim 1, wherein each mode of the N modes of electromagnetic radiation has a wavelength of between 700 nm and 1600 nm.

4. An interferometer as claimed in claim 1, wherein N is greater than 3.

5. An interferometer as claimed in claim 1, wherein the couplings between pairs of modes at each reconfigurable beam splitter of the plurality of reconfigurable beam splitters are determined by:

receiving a unitary matrix describing a desired transformation to be performed by the interferometer;

operating on the unitary matrix with a plurality of transformation matrices to decompose the unitary matrix into a diagonal matrix, wherein each transformation matrix of the plurality of transformation matrices used to decompose the unitary matrix represents the coupling between a pair of modes at a crossing point of a pair of adjacent waveguides, and wherein the transformation matrices are arranged to operate on the unitary matrix in an order that matches a sequence in which the crossing points in the interferometer may be arranged; and determining, using the transformation matrices, the coupling for the pair of modes of electromagnetic radiation at each crossing point of the plurality of crossing points.

6. An interferometer as claimed in claim 5, wherein each transformation matrix of the plurality of transformation matrices comprises one or more elements that are representative of a reflectivity and a phase shift of the coupling between the pair of modes of electromagnetic radiation at the respective crossing point, and the couplings between the pairs of modes of electromagnetic radiation at each of the reconfigurable beam splitters are further determined by:

determining a reflectivity coefficient and a phase shift coefficient from each transformation matrix of the plurality of transformation matrices; and determining, using the reflectivity coefficient and the phase shift coefficient, the reflectivity and phase shift for the coupling of each pair of modes of electromagnetic radiation at the respective crossing points.

7. An interferometer as claimed in claim 6, wherein a reconfigurable beam splitter is arranged at each of one or more crossing points of the plurality of crossing points, and each reconfigurable beam splitter of the plurality of reconfigurable beam splitters is configured to couple the pair of modes of electromagnetic radiation at each crossing point of the plurality of crossing points according to the determined reflectivity coefficient and the determined phase shift coefficient.

8. An interferometer as claimed in claim 7, wherein each reconfigurable beam splitter of the plurality of reconfigurable beam splitters is adjustable.

9. An interferometer as claimed in claim 5, wherein the couplings between pairs of modes of electromagnetic radiation at each reconfigurable beam splitter are further determined by defining a unitary matrix describing the desired transformation to be performed by the interferometer.

10. An interferometer as claimed in claim 5, wherein the unitary matrix is defined by an N×N unitary matrix that describes the transformation of annihilation operators of the N modes of electromagnetic radiation of the interferometer that the unitary matrix represents, wherein the annihilation operators and the unitary matrix satisfy the equation: $a_{out} = \hat{U} a_{in}$, where $\hat{a}_{out} = (\hat{a}_{out,1}, \hat{a}_{out,2}, \ldots, \hat{a}_{out,N})$ and $\hat{a}_{in} = (\hat{a}_{in,1}, \hat{a}_{in,2}, \ldots, \hat{a}_{in,N})$ are column vectors representing the annihilation operators of all the N input modes of electromagnetic radiation and all the N output modes of electromagnetic radiation respectively.

11. An interferometer as claimed in claim 5, wherein each transformation matrix of the plurality of transformation matrices is defined as an N×N matrix $T_{m,n}(\theta,\phi)$, which is identity except for the (m,m), (m,n), (n,m) and (n,n) elements, that form a 2×2 sub-matrix that performs the transformation:

$$\begin{bmatrix} \hat{a}_{m,out} \\ \hat{a}_{n,out} \end{bmatrix} = \begin{bmatrix} e^{i\phi}\cos\theta & -\sin\theta \\ e^{i\phi}\sin\theta & \cos\theta \end{bmatrix} \begin{bmatrix} \hat{a}_{m,in} \\ \hat{a}_{n,in} \end{bmatrix},$$

where each transformation matrix describing the coupling between modes m and n of electromagnetic radiation is defined as a reflectivity of $\cos\theta$, and a phase shift of $\phi$ at input m, wherein m<n.

12. An interferometer as claimed in claim 11, wherein the unitary matrix $\hat{U}$ is decomposed into a product of a plurality of $T_{m,n}$ matrices that satisfy:

$$\hat{U} = \hat{D} \prod_{(m,n) \in S} \hat{T}_{m,n}$$

wherein S defines an ordered sequence in which the $\hat{T}_{m,n}$ matrices are to be applied to the unitary matrix $\hat{U}$ in turn and $\hat{D}$ is the resultant diagonal matrix, and wherein the interferometer is designed with a plurality of reconfigurable beam splitters and phase shifters arranged in the ordered configuration determined by S, and wherein the reconfigurable beam splitters and phase shifters are each configured to have the values of $\theta$ and $\phi$ as determined by the respective transformation matrix.

13. An interferometer as claimed in claim 5, wherein the couplings between the pairs of modes of electromagnetic radiation at each reconfigurable beam splitter are further determined by operating on the unitary matrix with the plurality of transformation matrices, wherein the operation of each transformation matrix on the unitary matrix nulls a respective different non-diagonal element of the unitary matrix.

14. An interferometer as claimed in claim 5, wherein the couplings between pairs of modes of electromagnetic radiation at each reconfigurable beam splitter are further determined by operating on the unitary matrix with the plurality of transformation matrices, wherein the operation of each transformation matrix on the unitary matrix nulls the elements of a lower or upper triangle of the unitary matrix to decompose the unitary matrix.

15. An interferometer as claimed in claim 14, wherein the elements of the lower or upper triangle of the unitary matrix are nulled in an order such that a triangle of increasing size of nulled elements is formed until a whole of the lower or upper triangle has been nulled.

16. An interferometer as claimed in claim 13, wherein the initial element nulled is the bottom left hand corner element in the lower triangle or the top right hand corner element in the upper triangle of the unitary matrix.

17. An interferometer as claimed in claim 13, wherein when the initial element nulled is the bottom left hand corner element in the lower triangle of the unitary matrix, the order in which the elements of the unitary matrix are nulled, for an N×N unitary matrix $\hat{U}$ is:

```
for i from 1 to N-1:
    when i is odd:
        looping over j from 0 to i-1:
            null element (N-j,i-j);
    when i is even:
        looping over j from 1 to i:
            null element (N+j-i,j).
```

18. An interferometer as claimed in claim 13, wherein when the initial element nulled is the bottom left hand corner element in the lower triangle of the unitary matrix, the order in which the transformation matrices are applied to the unitary matrix, for an N×N unitary matrix $\hat{U}$ is:

```
for i from 1 to N−1:
    when i is odd:
        looping over j from 0 to i−1:
            multiply Û (updated from the previous step) from the right with a T̂_{i−j,i−j+1}^{−1} matrix;
    when i is even:
        looping over j from 1 to i:
            multiply Û (updated from the previous step) from the left with a T̂_{N+j−i−1,N+j−i} matrix.
```

\* \* \* \* \*